United States Patent
Tanaka

(10) Patent No.: US 6,720,680 B1
(45) Date of Patent: Apr. 13, 2004

(54) FLAT MOTOR DEVICE AND ITS DRIVING METHOD, STAGE DEVICE AND ITS DRIVING METHOD, EXPOSURE APPARATUS AND EXPOSURE METHOD, AND DEVICE AND ITS MANUFACTURING METHOD

(75) Inventor: Keiichi Tanaka, Funabashi (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/890,934

(22) PCT Filed: Feb. 2, 2000

(86) PCT No.: PCT/JP00/00558

§ 371 (c)(1),
(2), (4) Date: Aug. 6, 2001

(87) PCT Pub. No.: WO00/46911

PCT Pub. Date: Aug. 10, 2000

(30) Foreign Application Priority Data

Feb. 4, 1999 (JP) .......................................... 11-026840

(51) Int. Cl.[7] ............................................... H02K 41/00
(52) U.S. Cl. ........................................ 310/12; 355/53
(58) Field of Search ............................ 310/12, 13, 14; 318/135; 355/53, 72

(56) References Cited

U.S. PATENT DOCUMENTS

| | | | | |
|---|---|---|---|---|
| 3,376,578 A | * | 4/1968 | Sawyer | 310/12 |
| 4,924,258 A | * | 5/1990 | Tsutsui | 355/53 |
| 4,985,651 A | * | 1/1991 | Chitayat | 310/12 |
| 5,334,892 A | * | 8/1994 | Chitayat | 310/12 |
| 5,488,566 A | * | 1/1996 | Woolsey | 364/488 |
| 5,565,718 A | * | 10/1996 | Takei | 310/12 |
| 6,175,169 B1 | * | 1/2001 | Hollis, Jr. et al. | 310/12 |
| 6,326,752 B1 | * | 12/2001 | Jensen et al. | 318/439 |
| 6,339,266 B1 | * | 1/2002 | Tanaka | 310/12 |

FOREIGN PATENT DOCUMENTS

| | | |
|---|---|---|
| JP | 54-145911 | 11/1979 |
| JP | 62-135297 | 6/1987 |
| JP | 5-134753 | 6/1993 |
| JP | 10-50801 | 2/1998 |
| JP | 10-206104 | 8/1998 |
| JP | 10-206104 A1 * | 8/1998 |
| JP | 11-98813 | 4/1999 |

OTHER PUBLICATIONS

Computer translation of Japanese reference 10–206104 by Arai Eisaku, which was published in Japanese on Aug. 7, 1998.*
U.S. patent application Ser. No. 09/665,055, filed Sep. 19, 2000, allowed.
U.S. patent application Ser. No. 09/890,934, filed Aug. 6, 2001, pending.

* cited by examiner

Primary Examiner—Burton S. Mullins
Assistant Examiner—Judson H. Jones
(74) Attorney, Agent, or Firm—Oblon, Spivak, McClelland, Maier & Neustadt, P.C.

(57) ABSTRACT

An armature unit is made up of a matrix of armature coils each having a rectangular current path. A magnetic pole unit is made up of thrust generating magnets arranged in a matrix at arrangement periods each of which is an integral multiple of each of the arrangement periods at which the armature coils are arranged and having a rectangular magnetic pole surface, interpolating magnets for reinforcing the magnetomotove force, and a magnetic member. A mover is supported by air levitation above a guide surface by the pressure of pressurized gas, and the current supplied to the armature coils is controlled, thus driving the mover. An armature coil is housed in a closed space within a base, and a coolant is supplied from a cooling device into the closed space, thereby cooling the armature coils. Therefore, a substrate mounted on a substrate table integrated with the mover is precisely positioned.

74 Claims, 18 Drawing Sheets

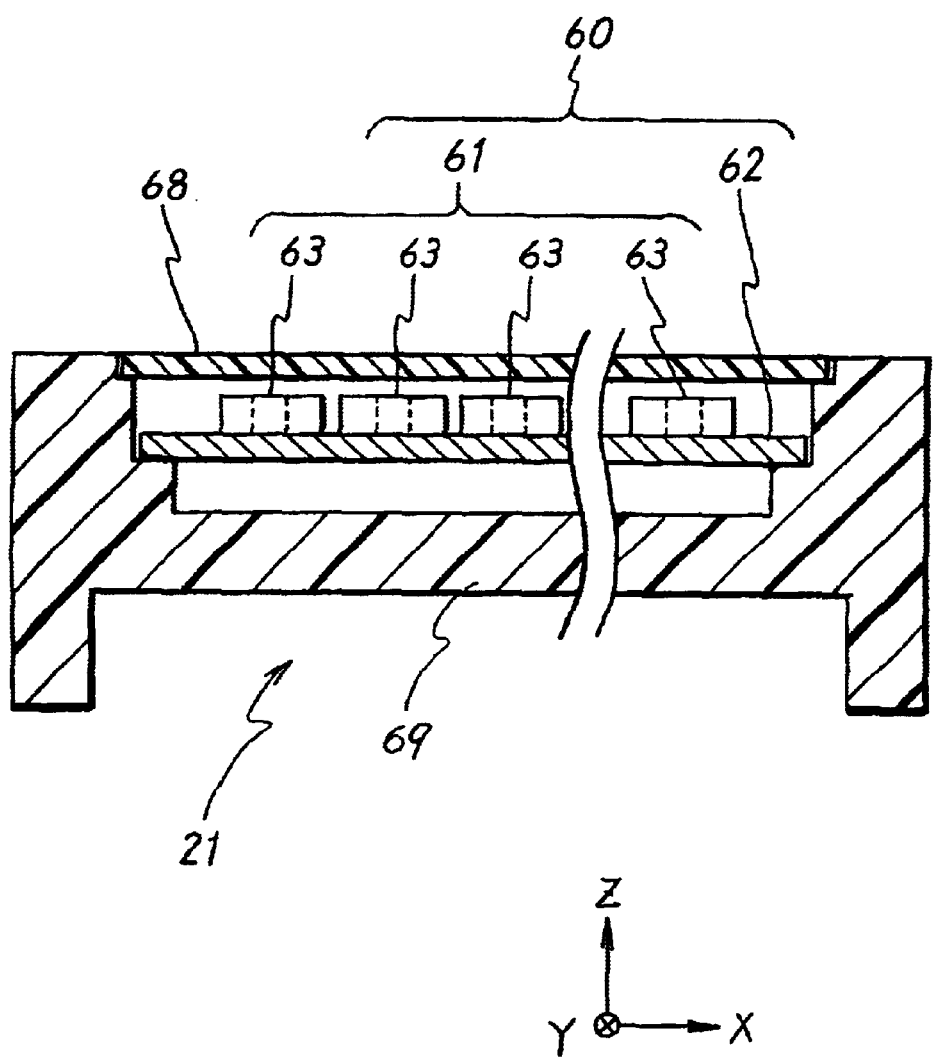

| L=0 | L=0 | L=0 | L=0 | L=0 | L=0 | L=0 |
|-----|-----|-----|-----|-----|-----|-----|
| L=0 | L=0 | L=0.1 | L=0.9 | L=1 | L=0 | L=0 |
| L=0 | L=1 | L=1 | L=1 | L=1 | L=0.1 | L=0 |
| L=0 | L=0.9 | L=1 | L=1 | L=1 | L=0.9 | L=0 |
| L=0 | L=0.1 | L=1 | L=1 | L=1 | L=0.1 | L=0 |
| L=0 | L=0 | L=1 | L=0.9 | L=0.1 | L=0 | L=0 |
| L=0 | L=0 | L=0 | L=0 | L=0 | L=0 | L=0 |

Fig. 13
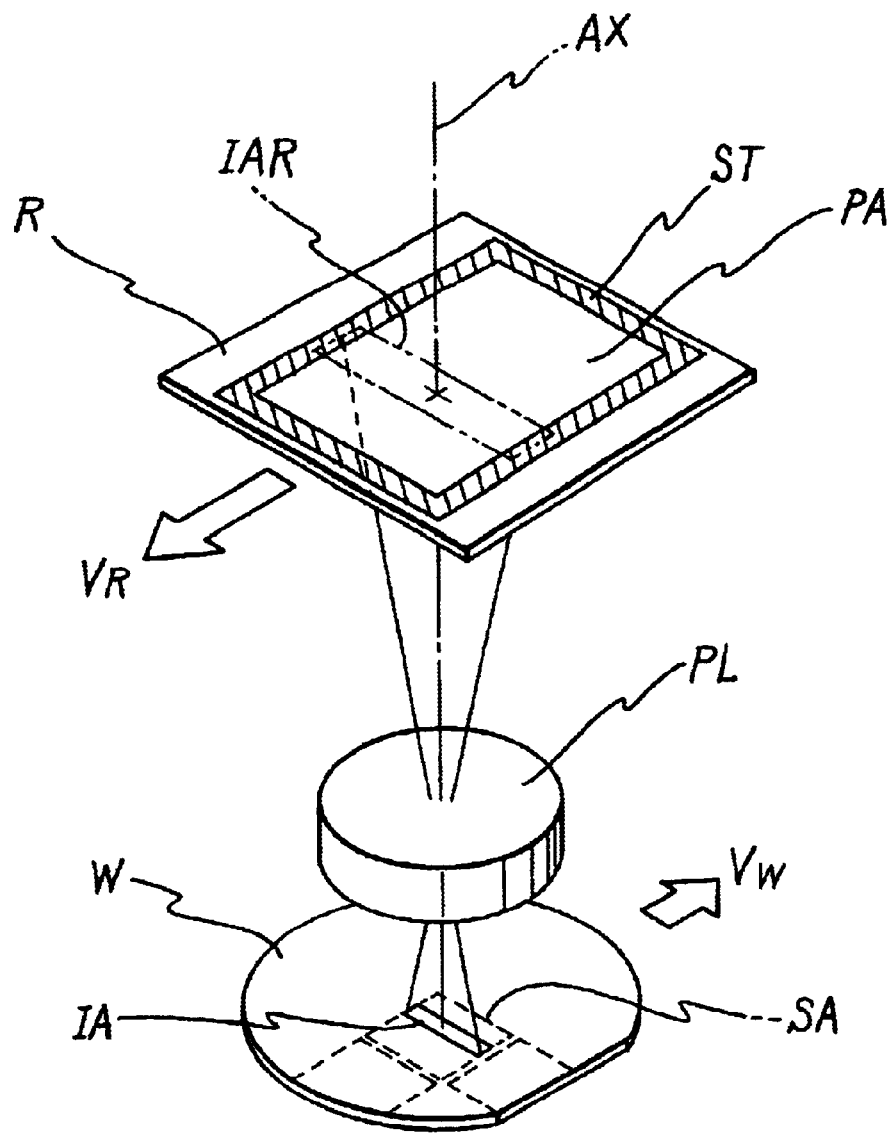
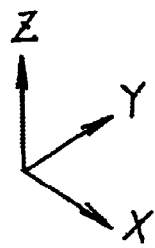

FLAT MOTOR DEVICE AND ITS DRIVING METHOD, STAGE DEVICE AND ITS DRIVING METHOD, EXPOSURE APPARATUS AND EXPOSURE METHOD, AND DEVICE AND ITS MANUFACTURING METHOD

TECHNICAL FIELD

The present invention relates to a planar motor unit and its driving method, a stage unit and its driving method, an exposure apparatus and exposure method, and a device and device manufacturing method, and more specifically to a planar motor unit that generates a driving force and its driving method, a stage unit that drives a stage by the use of the planar motor unit and its driving method, an exposure apparatus and exposure method that perform exposure while controlling position of a body mounted on the stage by the use of the stage unit, and a device manufactured by using the exposure apparatus and manufacturing method.

BACKGROUND ART

In a lithography process for manufacturing semiconductor devices, liquid crystal display devices, or the like, an exposure apparatus has been used that transfers a pattern formed on a mask or reticle (both referred to as a "reticle" hereinafter) onto a wafer or a substrate such as a glass plate (referred to as a "substrate" or "wafer" hereinafter, as needed), which is coated with a resist, through a projection optical system. As such an exposure apparatus, a stationary-exposure-type projection exposure apparatus, e.g. a so-called stepper, and a scanning-exposure-type projection exposure apparatus, e.g. a so-called scanning-stepper, are mainly used. These projection exposure apparatuses comprise a stage unit, which is movable in two dimensions while holding a wafer, so as to transfer a pattern formed on a reticle onto a plurality of shot areas on the wafer sequentially.

Such a stage unit needs to have the capability of highly accurately positioning a wafer for accurate exposure and also the capability of positioning a wafer at high speed for high throughput of exposure. In these needs, stage units have been developed which accurately position a wafer at higher speed without being affected by mechanical precision of the guide surface, etc., while driving the table, on which the wafer is mounted, in non-contact and in two dimensions so as to avoid mechanical friction and to prolong the life. With respect to the driving source of such a stage unit, a stage unit using a planar-motor having two linear pulse motors, of a variable-magnetic-reluctance driving method, each for an axis, and a stage unit using a planar motor as a driving unit employing an electromagnetic-force driving method disclosed in, for example, Japanese-Patent Laid-Open No. 58-175020 and U.S. Pat. No. 5,196,745 have been suggested.

The electromagnetic-force driving method has the advantages that theoretical design on the basis of the Lorentz force can be easily performed, and that the linearity between a current and a thrust is good up to a high frequency, and is also excellent in controllability because the variation of the thrust is small if using no iron core. Meanwhile, it has been difficult to obtain a driving force equivalent to that of the variable-magnetic-reluctance driving method. However, due to recent remarkable development of high-performance permanent magnets, a permanent magnet of which the energy product is more than $3 \times 10^5$ [T.A/m] (about $4 \times 10^7$ [G.Oe]) is available in the market, and the electromagnetic-force driving method is attracting attention.

Such a planar motor of the electromagnetic-force driving method, which can generate a force of large magnitude, comprises a magnetic pole unit having magnets and an armature unit having armature coils, and generates a driving force of electromagnetic interaction by supplying currents to the armature coils of the armature unit facing an alternating magnetic field which is generated by the magnetic pole unit and which is periodic in space. Upon supplying currents to the armature unit, the relative position and speed between the armature unit and the magnetic pole unit are controlled by supplying, for example, sine-wave currents each having a different phase, according to the positional relation between the armature unit and the magnetic pole unit. Therefore, the detection of the positional relation between the armature unit and the magnetic pole unit is indispensable, and at least three position-detection means are necessary to control translational movement on a movement plane (movement in a X-direction and Y-direction) and rotation ($\theta$) or yaw about an axis (Z axis) perpendicular to the movement plane.

As such a position-detection means, exposure apparatuses employ, for example, a laser interferometer system including a plurality of laser interferometers, which system can achieve high resolution in non-contact. Such a laser interferometer is provided on a fixed side and obtains position of a stage as a movable side by making a laser beam incident on a movable mirror provided on the stage and detecting the reflected beam. Therefore, the X-Y position and yaw $\theta$ of the stage can be detected with high resolution. However, because in the laser interferometer the position of sending out the laser beam and the position of receiving the reflected beam are fixed, the yaw angle of the stage that can be detected is restricted by the detection limits of the reflected light. Therefore, when the yaw of the stage greatly changes because of malfunction or external disturbance, the position and yaw of the stage cannot be detected; the position control of the stage (including the yaw control) has to be suspended, and manual intervention is necessary to resume the position control of the stage.

The present invention has been made in such circumstances. A first object of the present invention is to provide a planar motor unit that can detect the position and yaw of a mover with respect to a stator regardless of the positional relation between the mover and the stator.

Furthermore, a second object of the present invention is to provide a stage unit that can detect its position and yaw regardless of variation amount of the yaw of the stage, and driving method thereof.

Moreover, a third object of the present invention is to provide an exposure apparatus and method that can detect the position and yaw of the stage unit regardless of variation amount of the yaw of the stage and control position of the stage for exposure operation.

Additionally, a fourth object of the present invention is to provide a device having a fine pattern accurately formed thereon, and manufacturing method thereof.

DISCLOSURE OF INVENTION

According to a first aspect of this invention, there is provided a first planar motor comprising: a stator having a coil; and a mover having a magnetic flux generator, the planar motor moving the mover on a movement plane, further comprising: a controller that detects position information of the mover based on information concerning an inductance of the coil, the inductance varying in accordance with the relative-position relation between the stator and the mover. The "magnetic flux generator" may be a magnet, a magnet module or the like that actively generates a magnetic field and that is equivalent to the above magnetic unit.

According to this, the controller detects position information of the mover based on information concerning an inductance of the coil, the inductance varying in accordance with the relative-position relation between the stator and the mover. Therefore, even if the position and yaw of the mover relative to the stator greatly change due to malfunction or external disturbances, the position information of the mover relative to the stator can be successively detected.

There is provided a planar motor according to the first planar motor, wherein the stator comprises a plurality of coils, and wherein the controller detects position information of the mover based on an inductance distribution with respect to the plurality of coils, the inductance distribution being generated in accordance with the relative-position relation between the stator and the mover.

In addition, in the first planar motor, the stator may comprise a coil-supporting member that is made of a magnetic material and that supports the plurality of coils. In this case, because a magnetic circuit is formed through the coil-supporting member made of a magnetic material, the magnetic circuit has low magnetic reluctance and is stable, and the inductances of the coils can greatly vary according to the relative-position relation between the stator and the mover. Accordingly, position information of the mover can be easily detected based on the inductance distribution.

Furthermore, there is provided a planar motor according the first planar motor, wherein the position information of the mover includes at least one of a piece of position information with respect to a first axis direction and a second axis direction that define the movement plane, and a piece of position information with respect to rotation about a third axis perpendicular to the first axis direction and the second axis direction. That is, position information of the mover to be detected may be position information with respect to at least one of three degrees of freedom in a plane parallel to the movement plane.

Moreover, in the first planar motor of this invention, the controller may control an electric current supplied to the coil based on a detection result of position information of the mover. In this case, by the controller controlling an electric current supplied to the coil based on a detection result of position information of the mover, a Lorentz force generated in the coil can be controlled, and thus the reaction against the Lorentz force, which reaction is a driving force to the mover, can be controlled. Therefore, by controlling the driving force to the mover according to the position of the mover, the position of the mover can be accurately controlled.

In addition, in the first planar motor of this invention, the magnetic flux generator may comprise a plurality of magnets magnetized in a direction almost perpendicular to the movement plane. Also, the magnetic flux generator may further comprise a magnet-supporting member that is made of a magnetic material and that supports the plurality of magnets. In this case, because a magnetic circuit is formed through the magnet-supporting member made of a magnetic material, the magnetic circuit has low magnetic reluctance and is stable, and the inductances of the coils can greatly vary according to the positional relation between the magnet-supporting member and the coils. Accordingly, position information of the mover can be easily detected based on the inductance distribution.

Moreover, in the first planar motor of this invention, the magnetic flux generator may comprise a plurality of magnets magnetized in a direction not perpendicular to the movement plane. In this case, because no magnetic member is needed to constitute the stable magnetic circuit, the mover becomes lightweight.

It is noted that the magnetic flux generator may comprise a plurality of magnets magnetized in a direction almost perpendicular to the movement plane, and a plurality of magnets magnetized in a direction not perpendicular to the movement plane, needless to say.

Furthermore, the first planar motor of this invention may further comprise an inductance measurement unit to measure an inductance of the coil. In this case, by the inductance measurement unit measuring an inductance of the coil and sending the results to the controller, the controller can detect the position information of the mover based on the information of the inductance of the coil.

According to a second aspect of this invention, there is provided a second planar motor comprising: a stator having a coil; and a mover having a magnet, the planar motor moving the mover on a movement plane, further comprising: a controller that controls position of the mover based on information concerning an inductance of the coil, the inductance varying in accordance with the relative-position relation between the stator and the mover.

According to this, the controller controls position of the mover based on information concerning an inductance of the coil of the stator, the inductance varying in accordance with the relative-position relation between the stator and the mover. Therefore, even if the position and yaw of the mover relative to the stator greatly change due to malfunction or external disturbances, the position information of the mover can be successively and accurately controlled.

There is provided a planar motor according to the second planar motor, wherein the stator comprises a plurality of coils, and wherein the controller controls position of the mover based on an inductance distribution with respect to the plurality of coils, the inductance distribution being generated in accordance with the relative-position relation between the stator and the mover. In this case, the position of the mover can be accurately controlled based on the inductance distribution obtained from information with respect to the inductances of the coils.

Moreover, the second planar motor of this invention may further comprise an inductance measurement unit to measure an inductance of the coil. In this case, by the inductance measurement unit measuring an inductance of the coil and sending the results to the controller, the controller can control the position of the mover based on the information of the inductance of the coil.

According to a third aspect of this invention, there is provided a first stage unit comprising: one of the first and second planar motors; and a stage member connected with the mover.

According to this, by connecting the stage member with the mover in the first planar motor and detecting the position information of the mover in the above manner, even if the position and yaw of the stage member relative to the stator greatly change due to malfunction or external disturbances, the position information of the stage member can be successively detected.

Moreover, by connecting the stage member with the mover in the second planar motor and controlling the position of the mover in the above manner, even if the position and yaw of the stage member relative to the stator greatly change due to malfunction or external disturbances, the position of the stage member can be controlled in accordance with the position of the stage member.

According to a fourth aspect of this invention, there is provided a second stage unit comprising: a stage member moving on a movement plane; a driving unit comprising: a mover that has a magnetic flux generator and that is provided on the stage member and a stator having a plurality of coils, the driving unit driving the stage member by electromagnetic force; an inductance measurement unit to measure inductances of the coils; and a controller to control respective electric currents supplied to the plurality of coils based on measurement results by the inductance measurement unit.

According to this, by controlling respective electric currents supplied to the coils based on measurement results of inductances of the coils by the inductance measurement unit, the controller controls the driving force applied to the stage member by the driving unit, thereby controlling the position of the stage member, the inductances of the coils varying according to the relative-position relation between the stator and mover of the driving unit. Therefore, even if the position and yaw of the stage member greatly change due to malfunction or external disturbances, regardless of the position and yaw of the stage member, the position of the stage member can be accurately controlled in accordance with the relative-position relation between the mover or the stage member and the stator.

In the second stage unit of this invention, the magnetic flux generator may comprise a plurality of magnets magnetized in a direction almost perpendicular to the movement plane. Furthermore, there is provided a stage unit according to the second stage unit, wherein the stage member is made of a non-magnetic material, and wherein the magnetic flux generator further comprises a magnet-supporting member that is made of a magnetic material and that supports the plurality of magnets. In this case, because a magnetic circuit is formed through the magnet-supporting member made of a magnetic material, the magnetic circuit has low magnetic reluctance and is stable, and the inductances of the coils greatly vary according to the relative-position relation between the magnet-supporting member and the coils. Accordingly, position information of the stage member can be easily detected based on the measured inductances, and the position of the stage member can be accurately and quickly controlled.

In addition, in the second stage unit of this invention, the magnetic flux generator may comprise a plurality of magnets magnetized in a direction not perpendicular to the movement plane. In this case, because no magnetic member is needed to constitute the stable magnetic circuit, the mover becomes lightweight.

Moreover, in the second stage unit of this invention, the stator may comprise a coil-supporting member that is made of a magnetic material and that supports the plurality of coils. In this case, because a magnetic circuit is formed through the magnet-supporting member made of a magnetic material, the magnetic circuit has low magnetic reluctance and is stable, and the inductances of the coils greatly vary according to the relative-position relation between the stator and the mover. Accordingly, position information of the stage member can be easily detected based on the measured inductances, and the position of the stage member can be quickly controlled.

In addition, there is provided a stage unit according to the second stage unit, further comprising: a position detection unit to detect position of the stage member, and wherein the controller controls respective electric currents supplied to the plurality of coils based on at least one of a detection result by the position detection unit and a set of measurement results by the inductance measurement unit. As the position detection unit, an accurate-position detection unit such as a laser interferometer system can be used. In this case, because the controller controls respective electric currents supplied to the coils so as to control the position of the stage member, the position of the stage member can be controlled based on a detection result by the position detection unit or based on a set of measurement results by the inductance measurement unit, depending on the situation. Therefore, the position of the stage member can be successively and accurately controlled.

Furthermore, there is provided a stage unit according to the second stage unit, wherein when the position detection unit can detect position of the stage member, the controller controls position of the stage member by controlling respective electric currents supplied to the plurality of coils based on a detection result by the position detection unit, and wherein when the position detection unit cannot detect position of the stage member, the controller controls position of the stage member by controlling respective electric currents supplied to the plurality of coils based on measurement results by the inductance measurement unit. In this case, when although the position detection accuracy of the position detection unit is higher than the detection accuracy of the position information of the mover (or the stage member) based on measurement results by the inductance measurement unit, there is a range over which the position detection unit cannot detect the position and/or yaw of the stage member, the position of the stage member can be successively controlled with an accuracy as high as possible depending on the position and yaw of the stage member.

According to a fifth aspect of this invention, there is provided a first exposure apparatus comprising: an illumination system sending out illumination light for exposure; the first stage unit of this invention on which an object to be arranged in a path of the illumination light is mounted.

According to this, because an object to be arranged in a path of the illumination light for exposure is mounted on the first stage unit of this invention, in the case of the first stage unit comprising the first planar motor of this invention, even if the position and yaw of the stage member greatly change due to malfunction or external disturbances, the position information of the stage member, i.e. the position information of the object, can be successively and accurately detected. Meanwhile, in the case of the first stage unit comprising the second planar motor of this invention, even if the position and yaw of the stage member greatly change due to malfunction or external disturbances, the position of the stage member, i.e. the position of the object, can be successively and accurately controlled. Therefore, exposure operation on the object by the illumination light can continue without suspension, and the throughput of exposure is improved.

According to a sixth aspect of this invention, there is provided a second exposure apparatus comprising: an illumination system sending out illumination light for exposure; the second stage unit of this invention, on which an object to be arranged in a path of the illumination light is mounted.

According to this, because an object to be arranged in a path of the illumination light for exposure is mounted on the second stage unit of this invention, even if the position and yaw of the stage member of the stage unit greatly change, the position of the stage member, i.e. the position of the object, can be successively and accurately controlled. Therefore, exposure operation for the object by the illumination light can continue without suspension, and the throughput of exposure is improved.

In the second exposure apparatus, the object may be a substrate which is exposed by the illumination light, and onto which a predetermined pattern is transferred. In this case, because regardless of the position and yaw of the substrate, the position and yaw of the substrate can be successively controlled, the throughput of exposure operation of transferring a predetermined pattern onto the substrate can be improved.

Furthermore, there is provided an exposure apparatus according to the second exposure apparatus, wherein the stage unit comprises a position detection unit to detect position of the stage member, wherein when the position detection unit can detect position of the stage member, the controller controls position of the stage member by controlling respective electric currents supplied to the plurality of coils based on a detection result by the position detection unit, wherein when the position detection unit cannot detect position of the stage member, the controller controls position of the stage member by controlling respective electric currents supplied to the plurality of coils based on measurement results by the inductance measurement unit, and wherein upon exposure, when it is judged that the reason why the position detection unit cannot detect position of the stage member is the stage member being out of a range over which the position detection unit can detect position thereof, the controller restores the stage member to within the detection range of the position detection unit based on measurement results by the inductance measurement unit. In this case, usually by detecting the position and yaw of the stage member with anaccurate-position detection unit such as a laser interferometer system, the position and yaw of the stage member is controlled. And if due to, for example, a large variation of the yaw, the position detection unit cannot detect position of the stage member, the controller detects the position and yaw of the stage member based on inductance distribution, measured by the inductance measurement unit, with respect to the plurality of coils, controls position of the stage member, and restores the position and yaw of the stage member to within the detection range of the position detection unit. After the restoration, the controller controls the position of the stage member by detecting the position and yaw of the stage member again with the position detection unit. Therefore, the position of the stage member can be successively controlled.

In such a case, after the restoration of the stage member the controller may continue to control the position of the stage member for exposure based on a detection result by the position detection unit. Or after the restoration of the stage member the controller may move the stage member to an initial position based on a detection result by the position detection unit.

Moreover, there is provided an exposure apparatus according to the second exposure apparatus, wherein the stage unit comprises a position detection unit to detect position of the stage member, wherein when the position detection unit can detect position of the stage member, the controller controls position of the stage member by controlling respective electric currents supplied to the plurality of coils based on a detection result by the position detection unit, wherein when the position detection unit cannot detect position of the stage member, the controller controls position of the stage member by controlling respective electric currents supplied to the plurality of coils based on measurement results by the inductance measurement unit, and wherein upon exposure, when the position detection unit cannot detect position of the stage member, the controller controls position of the stage member for exposure based on measurement results by the inductance measurement unit.

According to a seventh aspect of this invention, there is provided a first driving method that drives a planar motor comprising: a stator having a coil; and a mover having a magnetic flux generator, so as to move the mover on a movement plane, wherein position information of the mover is detected based on information concerning an inductance of the coil, the inductance varying in accordance with the relative-position relation between the stator and the mover.

According to this, position information of the mover is detected based on information concerning an inductance of the coil of the stator, the inductance varying in accordance with the relative-position relation between the stator and the mover. Therefore, even if the position and yaw of the mover relative to the stator greatly change due to malfunction or external disturbances, the position information of the mover, relative-position relation with respect to the stator, can be successively detected.

There is provided a driving method of a planar motor according to the first driving method of a planar motor, wherein the stator comprises a plurality of coils, and wherein position information of the mover is detected based on an inductance distribution with respect-to the plurality of coils, the inductance distribution being generated in accordance with the relative-position relation between the stator and the mover. In this case of the stator comprising a plurality of coils, the position information of the mover can be accurately detected based on an inductance distribution obtained from information with respect to the inductances of the coils.

In the first driving method, the stator may comprise a coil-supporting member that is made of a magnetic material and that supports the plurality of coils. In this case, because a magnetic circuit is formed through the coil-supporting member made of a magnetic material, the magnetic circuit has low magnetic reluctance and is stable, and the inductances of the coils can vary according to the relative-position relation between the stator and the mover. Accordingly, position-information of the mover can be easily detected based on the inductance distribution.

Furthermore, inductances of the plurality of coils may be measured individually. In this case, an inductance distribution can be obtained from the individually measured inductances of the coils.

Moreover, there is provided a driving method of a planar motor according to the first driving method of a planar motor, wherein the position information of the mover includes at least one of a piece of position information with respect to a first axis direction and a second axis direction that define the movement plane, and a piece of position information with respect to rotation about a third axis perpendicular to the first axis direction and the second axis direction.

In addition, in the first driving method of a planar motor of this invention, an electric current supplied to the coil may be controlled based on a detection result of position information of the mover. In this case, by controlling an electric current supplied to the coil based on a detection result of position information of the mover, a Lorentz force generated in the coil can be controlled, and thus the reaction against the Lorentz force, which reaction is a driving force to the mover, can be controlled. Therefore, by controlling the driving force to the mover according to the position information of the mover, the position of the mover can be accurately controlled.

In addition, in the first driving method of a planar motor of this invention, the magnetic flux generator may comprise a plurality of magnets magnetized in a direction almost perpendicular to the movement plane. Also, the magnetic flux generator may further comprise a magnet-supporting member that is made of a magnetic material and that supports the plurality of magnets. In this case, because a magnetic circuit is formed through the magnet-supporting member made of a magnetic material, the magnetic circuit has low magnetic reluctance and is stable, and the inductances of the coils can vary according to the relative-position relation between the magnet-supporting member and the coils. Accordingly, position information of the mover can be easily detected based on the inductance distribution.

Moreover, in the first driving method of a planar motor of this invention, the magnetic flux generator may comprise a plurality of magnets magnetized in a direction not perpendicular to the movement plane. In this case, because no magnetic member is needed to constitute the stable magnetic circuit, the mover becomes lightweight.

According to a eighth aspect of this invention, there is provided a second driving method that drives a planar motor comprising: a stator having a coil; and a mover having a magnet, so as to move the mover on a movement plane, wherein position of the mover is controlled based on information concerning an inductance of the coil, the inductance varying in accordance with the relative-position relation between the stator and the mover.

According to this, position of the mover is controlled based on information concerning an inductance of the coil, the inductance varying in accordance with the relative-position relation between the stator and the mover. Therefore, even if the position and yaw of the mover relative to the stator greatly change due to malfunction or external disturbances, the position of the mover can be successively and accurately controlled.

In the second driving method of a planar motor of this invention, wherein the stator comprises a plurality of coils, and wherein position of the mover is controlled based on an inductance distribution with respect to the plurality of coils, the inductance distribution being generated in accordance with the relative-position relation between the stator and the mover. In the case of the stator comprising a plurality of coils, position of the mover is controlled based on an inductance distribution obtained from information with respect to the inductances of the coils.

In addition, inductances of the plurality of coils may be measured individually. In this case, an inductance distribution can be obtained from the individually measured inductances of the coils.

According to a ninth aspect of this invention, there is provided a first driving method that drives a stage unit comprising a planar motor which comprises a stator having a coil and a mover having a magnetic flux generator, and which moves the mover on a movement plane, and a stage member moving as one entity with the mover, wherein upon moving the stage member is used a driving method of a planar motor according to this invention.

According to this, in the case where, upon moving the stage member by moving the mover, the first driving method of a planar motor according to this invention is used, even if the position and yaw of the stage member relative to the stator greatly change due to malfunction or external disturbances, the stage member can be moved while successively and accurately detecting the position information of the stage member by detecting position information of the mover in the above manner.

Meanwhile, in the case where, upon moving the stage member by moving the mover, the second driving method of a planar motor according to this invention is used, even if the position and yaw of the stage member relative to the stator greatly change due to malfunction or external disturbances, the stage member can be moved while successively and accurately controlling the position of the stage member according to the position of the stage member by controlling position of the mover in the above manner.

According to a tenth aspect of this invention, there is provided a second driving method that drives a stage unit comprising a stage member moving on a movement plane and a driving unit comprising a mover which has a magnetic flux generator and which is provided on the stage member and a stator having a plurality of coils and driving the stage member by electromagnetic force, wherein respective electric currents supplied to the plurality of coils are controlled based on results of measuring inductances of the plurality of coils.

According to this, by controlling electric currents supplied to the coils based on measurement results of the coils' inductances in accordance with the relative-position relation between the stator and the mover of the driving unit, the driving force from the driving unit to the stage member is controlled. Therefore, even if the position and yaw of the stage member greatly change due to malfunction or external disturbances, regardless of the position and yaw of the stage member, the position of the stage member can be successively and accurately controlled in accordance with the relative-position-relation between the mover or the stage member and the stator.

In the second driving method of a stage unit according to this invention, the magnetic flux generator may comprise a plurality of magnets magnetized in a direction almost perpendicular to the movement plane. Furthermore, there is provided a driving method of a stage unit according to the second driving method, wherein the stage member is made of a non-magnetic material, and wherein the magnetic flux generator further comprises a magnet-supporting member that is made of a magnetic material and that supports the plurality of magnets. In this case, because a magnetic circuit is formed through the magnet-supporting member made of a magnetic material, the magnetic circuit has low magnetic reluctance and is stable, and the inductances of the coils can greatly vary according to the relative-position relation between the magnet-supporting member and the coils. Accordingly, position information of the stage member can be easily detected based on the measured inductances, and the position of the stage member can be accurately and quickly controlled.

In the second driving method of a stage unit according to this invention, the magnetic flux generator may comprise a plurality of magnets magnetized in a direction not perpendicular to the movement plane. In this case, because no magnetic member is needed to constitute the stable magnetic circuit, the mover becomes lightweight.

In the second driving method of a stage unit according to this invention, the stator may comprise a coil-supporting member that is made of a magnetic material and that supports the plurality of coils. In this case, because a magnetic circuit is formed through the coil-supporting member made of a magnetic material, the magnetic circuit has low magnetic reluctance and is stable, and the inductances of the coils can greatly vary according to the relative-position relation between the stator and the mover. Accordingly, position information of the stage member can be easily detected based on the measured inductances, and the position of the stage member can be quickly controlled.

Moreover, there is provided a driving method of a stage unit according to the second driving method, wherein the stage unit further comprises a position detection unit to detect position of the stage member, and wherein respective electric currents supplied to the plurality of coils are controlled based on at least one of a detection result by the position detection unit and a set of measurement results of the inductances. In this case, upon controlling respective electric currents supplied to the plurality of coils to control the position of the stage member, the position of the stage member is controlled based on a detection result by the position detection unit or based on measurement results by the inductance measurement unit, depending on the situation. Therefore, the position of the stage member can be successively and accurately controlled.

Also there is provided a driving method of a stage unit according to the second driving method, wherein when the position detection unit can detect position of the stage member, position of the stage member is controlled by controlling respective electric currents supplied to the plurality of coils based on the result of detecting position, and wherein when the position detection unit cannot detect position of the stage member, position of the stage member is controlled by controlling respective electric currents supplied to the plurality of coils based on measurement results of the inductances. In this case, when although the position detection accuracy of the position detection unit is higher than the detection accuracy of the position of the mover (or the stage member) based on measurement results by the inductance measurement unit, there is a range over which the position detection unit cannot detect the position and/or yaw of the stage member, the position of the stage member can be successively controlled with a highest possible accuracy depending on the position and yaw of the stage member.

According to a eleventh aspect of this invention, there is provided a first exposure method comprising the steps of sending out illumination light for exposure and, by driving a stage unit on which an object is mounted, moving the object relative to a path of the illumination light, wherein upon driving the stage unit is used the first driving method of a stage unit.

According to this, because upon moving the object into a path of the illumination light for exposure, the first driving method of a stage unit is used, even if the position and yaw of the stage member greatly change due to malfunction or external disturbances, the position of the stage member, i.e. The position of the object, can be successively and accurately detected and controlled. Therefore, exposure operation on the object by the illumination light can continue without suspension, and the throughput of exposure is improved.

According to a twelfth aspect of this invention, there is provided a second exposure method comprising the steps of sending out illumination light for exposure and, by driving a stage unit on which an object is mounted, moving the object relative to a path of the illumination light, wherein upon driving the stage unit is used the second driving method of a stage unit according to this invention.

According to this, because upon moving the object into a path of the illumination light for exposure, the second driving method of a stage unit is used, even if the position and yaw of the stage member greatly change due to malfunction or external disturbances, the position of the stage member, i.e. the position of the object, can be successively and accurately controlled. Therefore, exposure operation on the object by the illumination light can continue without suspension, and the throughput of exposure is improved.

In the second exposure method according to this invention, the object may be a substrate which is exposed by the illumination light, and onto which a predetermined pattern is transferred. In this case, because regardless of the position and yaw of the substrate, the position and yaw of the substrate can be successively controlled, the throughput of exposure operation of transferring a predetermined pattern onto the substrate can be improved.

Moreover, there is provided an exposure method according to the second exposure method, wherein the stage unit comprises a position detection unit to detect position of the stage member, wherein when the position detection unit can detect position of the stage-member, position of the stage member is controlled by controlling respective electric currents supplied to the plurality of coils based on the result of detecting position, and wherein when the position detection unit cannot detect position of the stage member, position of the stage member is controlled by controlling respective electric currents supplied to the plurality of coils based on measurement results of the inductances, and wherein upon exposure, when it is judged that the reason why the position detection unit cannot detect position of the stage member is the stage member being out of a range over which the position detection unit can detect position thereof, the stage member is restored to within the detection range of the position detection unit based on measurement results of the inductances. In this case, usually by detecting the position and yaw of the stage member with an accurate-position detection unit such as a laser interferometer system, the position and yaw of the stage member is controlled. And if due to, for example, a large variation of the yaw, the position detection unit cannot detect position of the stage member, the controller detects the position and yaw of the stage member based on inductance distribution, measured by the inductance measurement unit, with respect to the plurality of coils, controls position of the stage member, and restores the position and yaw of the stage member to within the detection range of the position detection unit. After the restoration, the controller controls the position of the stage member by detecting the position and yaw of the stage member again with the position detection unit. Therefore, the position of the stage member can be successively controlled.

In such a case, after the restoration of the stage member, the controller may continue to control the position of the stage member for exposure based on a detection result by the position detection unit. Or after the restoration of the stage member, the controller may move the stage member to an initial position based on a detection result by the position detection unit.

In addition, there is provided an exposure method according to the second exposure method, wherein the stage unit further comprises a position detection unit to detect position of the stage member, wherein when the position detection unit can detect position of the stage member, position of the stage member is controlled by controlling respective electric currents supplied to the plurality of coils based on a result of detecting position of the stage member, wherein when the position detection unit cannot detect position of the stage member, position of the stage member is controlled by controlling respective electric currents supplied to the plurality of coils based on measurement results of the inductances, and wherein upon exposure, when the position detection unit cannot detect position of the stage member, position of the stage member is controlled for exposure based on measurement results of the inductances.

Furthermore, in a lithography process, by performing exposure using an exposure apparatus of this invention employing an exposure method of this invention, fine, multi-layer patterns can be formed on a substrate with high overlay accuracy. Accordingly, highly integrated microdevices can be manufactured with high yield and improved productivity. Therefore, according to another aspect of the present invention, there are provided a device manufactured by using an exposure apparatus of this invention and a device manufacturing method using an exposure method of this invention.

BRIEF DESCRIPTION OF THE DRAWINGS

FIG. 4 is a cross-sectional view illustrating an arrangement around the stator;

FIG. 12 is a diagram illustrating an example of measurement results of inductances of armature coils;

FIG. 13 is a perspective view for explaining the principle of the scanning exposure;

BEST MODE FOR CARRYING OUT THE INVENTION

Figure 1:
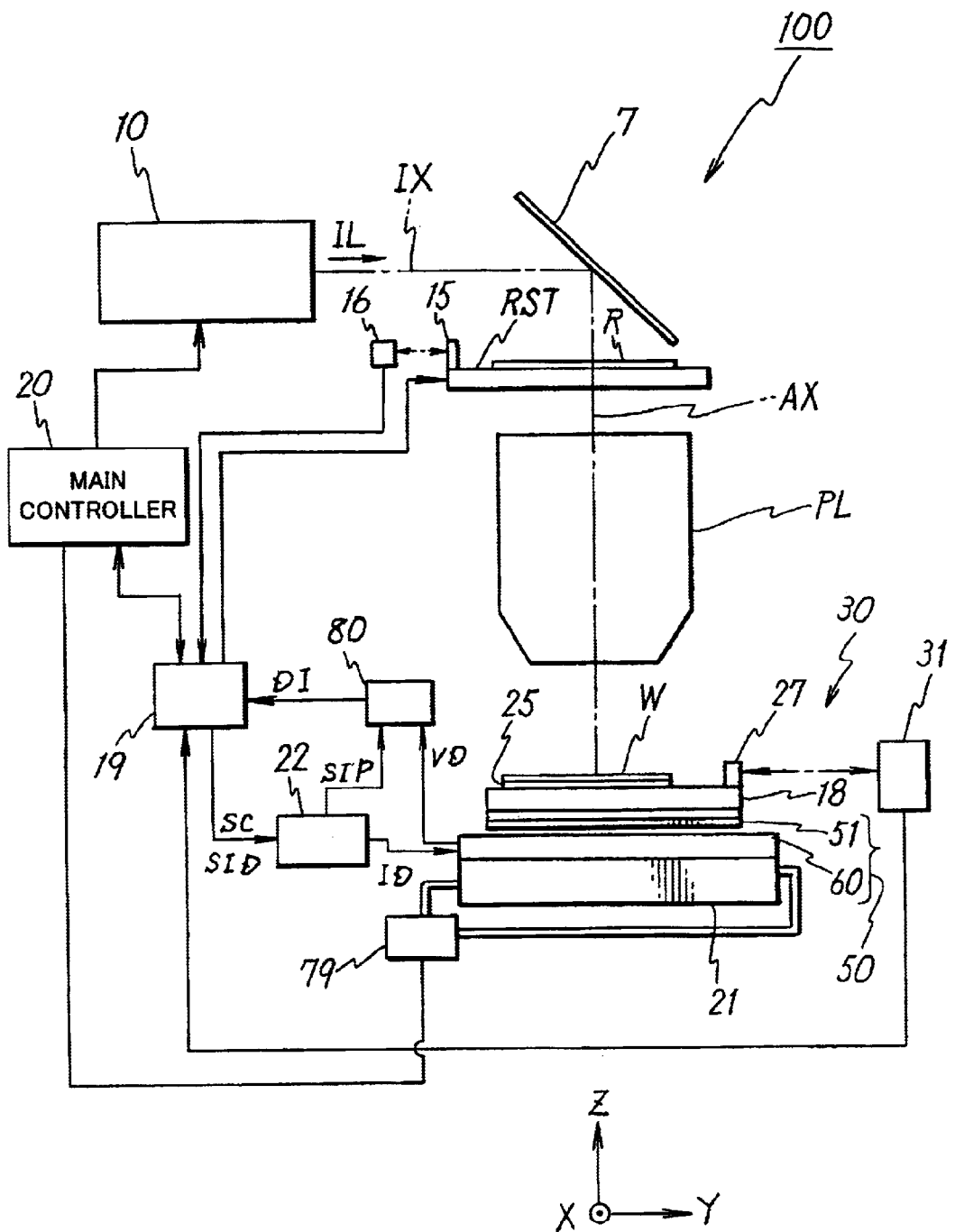
FIG. 1 is a diagram showing the schematic arrangement of an exposure apparatus according to an embodiment.

An embodiment of the present invention will be described below with reference to FIG. 1 through FIG. 15. FIG. 1 shows the entire arrangement of an exposure apparatus 100 according to the embodiment of the present invention. It is noted that this exposure apparatus 100 is a scanning exposure apparatus based on the so-called step-and-scan exposure method.

The exposure apparatus 100 comprises an illumination system 10, a reticle stage RST holding a reticle R, a projection optical system PL, a substrate stage unit 30 as a stage unit to drive a wafer W as a substrate in X-Y two-dimensional directions on an X-Y plane, and a control system for controlling these elements.

The illumination system 10 is composed of a light source, a shutter, a secondary light-source forming optical system, a beam splitter, a condenser lens system, a reticle blinder, an image-forming lens system, and the like (none of which are shown). The arrangement of such an illumination system is disclosed in, for example, Japanese Patent Laid-Open No. 9-32956. This illumination system 10 directs illumination light for exposure, having almost uniform illuminance distribution, toward a mirror 7 shown in FIG. 1. And then, this illumination light has its light path deflected vertically and downwards by the mirror 7, and illuminates an illumination area IAR (refer to FIG. 13) in the shape of a rectangle (or circular arc) on a reticle R with uniform illuminace.

The reticle R is fixed on the reticle stage RST by, for example, vacuum chucking. In order to control position of the reticle R, the reticle stage RST can be finely driven on a reticle base (not shown) on the X-Y plane perpendicular to the optical axis IX of the illumination system 10, which IX coincides with an optical axis AX of the projection optical system PL described later, by a reticle stage driving unit (not shown) constituted by a two-dimensional actuator composed of a magnetic-levitation-type linear motor using Lorentz force or reactance force, etc., and can also be driven in a predetermined scanning direction (the Y direction, herein) at a designated scanning velocity. In this embodiment, the above magnetic-levitation-type two-dimensional linear actuator includes a Z-driving coil in addition to X- and Y-driving coils, and hence can finely drive the reticle stage RST in a Z-direction as well.

A movable mirror 15 to reflect a laser beam from a reticle laser interferometer (to be referred to as a "reticle interferometer") as a position detection unit for the reticle stage RST (reticle R) is fixed on the reticle stage RST. The position of the reticle stage RST in a stage movement plane is detected all the time by a reticle interferometer 16 with a resolution of, for example, 0.5 to 1 nm.

Position information of the reticle stage RST from the reticle interferometer 16 is sent to a stage control system 19, and the stage control system 19 drives the reticle stage RST via a reticle stage driving portion (not shown) based on the position information of the reticle stage RST.

The projection optical system PL is arranged under the reticle stage RST as shown in FIG. 1, and the direction of the optical axis AX (coinciding with the optical axis IX of the illumination optical system) is set to be the Z-axis direction. In this embodiment, a refraction optical system is employed which is composed of a plurality of lenses disposed along the optical axis AX at predetermined intervals so as to make a double telecentric optical arrangement. The projection optical system PL is a reduction optical system having a predetermined magnification of, for example, ⅕ (or ¼, ⅙). Therefore, when the illuminating light emitted by the illumination system 10 illuminates the illumination area IAR of the reticle R, a reduced image (a partially inverted-image) of a circuit pattern on the reticle R is formed on an exposure area IA on a wafer W, which is conjugate to the illumination area IRA (refer to FIG. 13). The image is formed on the wafer W coated with a photo-resist, through the projection optical system PL by the illumination light that passes through the reticle R.

The stage unit 30 comprises: a base 21; a substrate table 18 supported by air levitation with an air slider (to be described later) above the upper surface of this base 21 with a clearance of several microns; and a driving unit 50 for driving the substrate table 18 in the X-Y plane in two-dimensional directions. As the driving unit 50, a planar motor is used that is composed of the stator 60 provided (embedded) in the upper portion of the base 21 and a mover 51 fixed to the bottom portion (the surface side facing the base) of the substrate table 18, and a planar motor unit is composed of the mover 51, the base 21, and the stator 60. Hereinafter, the driving unit 50 is referred to as a planar motor 50 for the sake of convenience.

Figure 2:
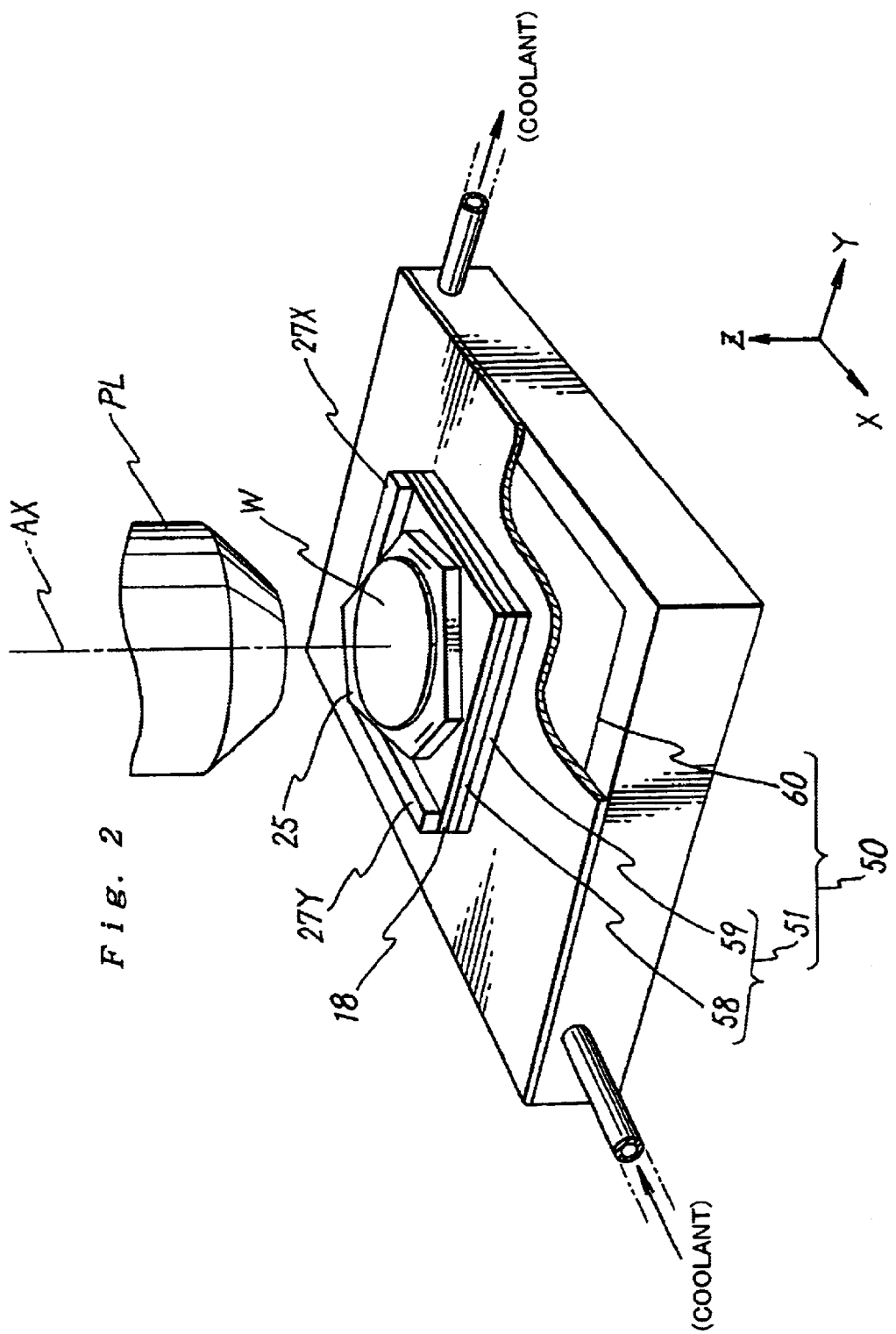
FIG. 2 is a perspective view showing an arrangement around the stage unit of the exposure apparatus of FIG. 1.
Figure 9A:
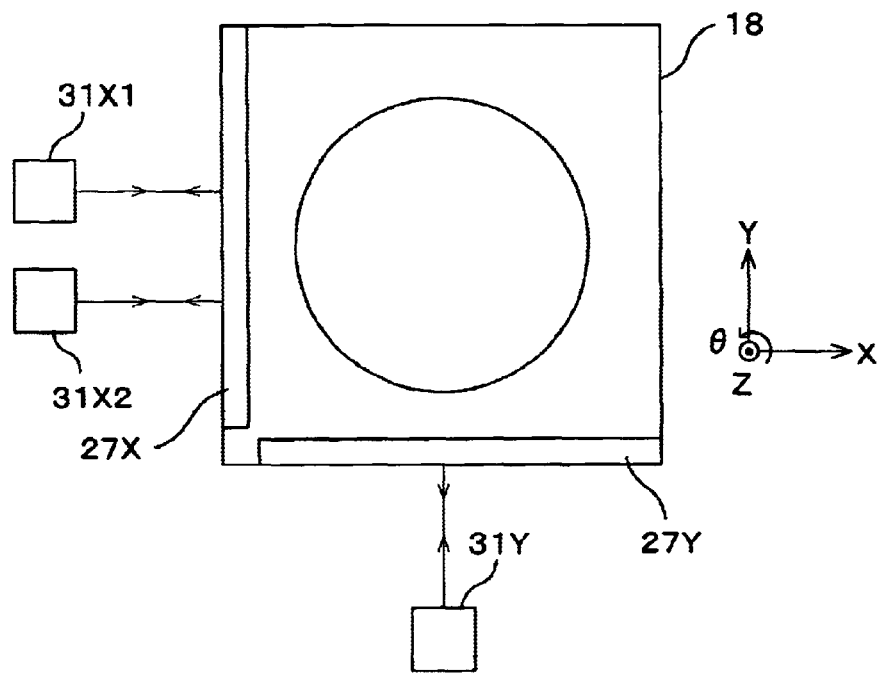
FIGS. 9A and 9B are diagrams for explaining a relation between whether or not a wafer interferometer can detect the position and yaw of a substrate table and the yaw of the substrate table.
Figure 9B:
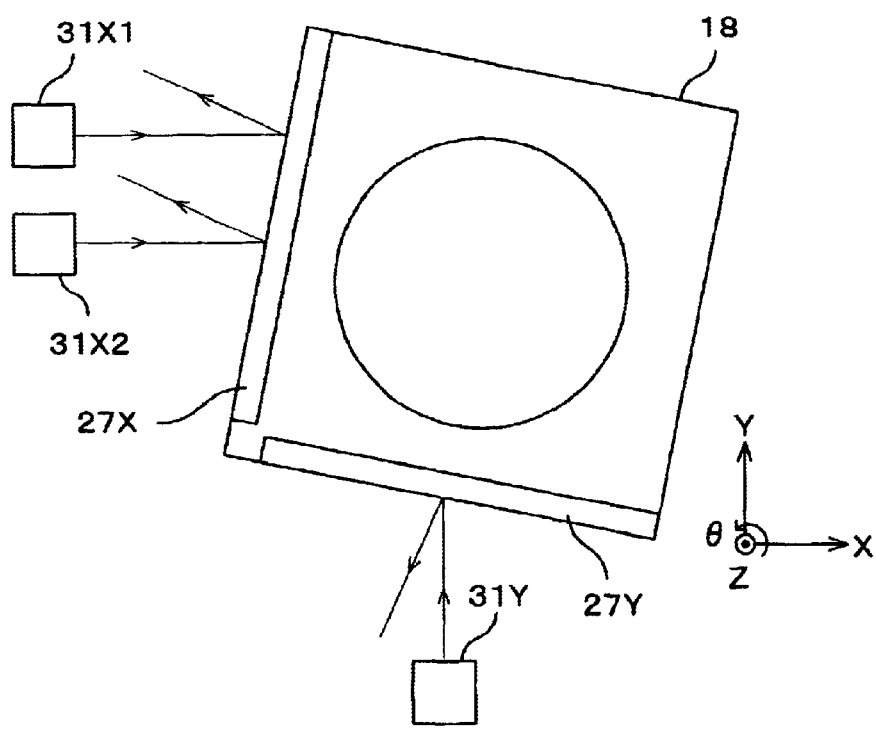

A wafer W is fixed on the substrate table 18 by using, for example, vacuum chucking. Furthermore, a movable mirror 27 to reflect a laser beam from a wafer laser interferometer (referred to as a "wafer interferometer" hereafter) 31 as a position detection unit for the substrate table (wafer W) is fixed on this substrate table 18. The position in the X-Y plane and the rotation around the Z-axis, that is, yaw θ of the substrate table 18 are detected all the time by the externally-placed wafer-interferometer 31 with a resolution, for example, of about 0.5 to 1 nm regarding the position in the X-Y plane. In practice as shown in FIG. 2, a movable mirror 27Y having a reflection surface perpendicular to the scanning direction (Y-axis direction) and a movable mirror 27X having a reflection surface perpendicular to the non-scanning direction (X-axis direction) are provided on the substrate table 18. And, as shown in FIG. 9A and FIG. 9B, the wafer interferometer 31 has a wafer interferometer 31Y of which the axis is in the scanning direction and wafer interferometers 31X1, 31X2 of which the axes are in the non-scanning direction. In FIG. 1, however, the movable mirror 27 and the wafer interferometer 31 are representatively shown. The position information (or speed information) of the substrate table 18 is sent to the stage control system 19 and then to the main controller 20, and the stage control system 19 controls the movement of the substrate table 18 in the X-Y plane via the driving unit 50 in accordance with instructions from the main controller 20 and based on the position information (or speed information).

Figure 3A:
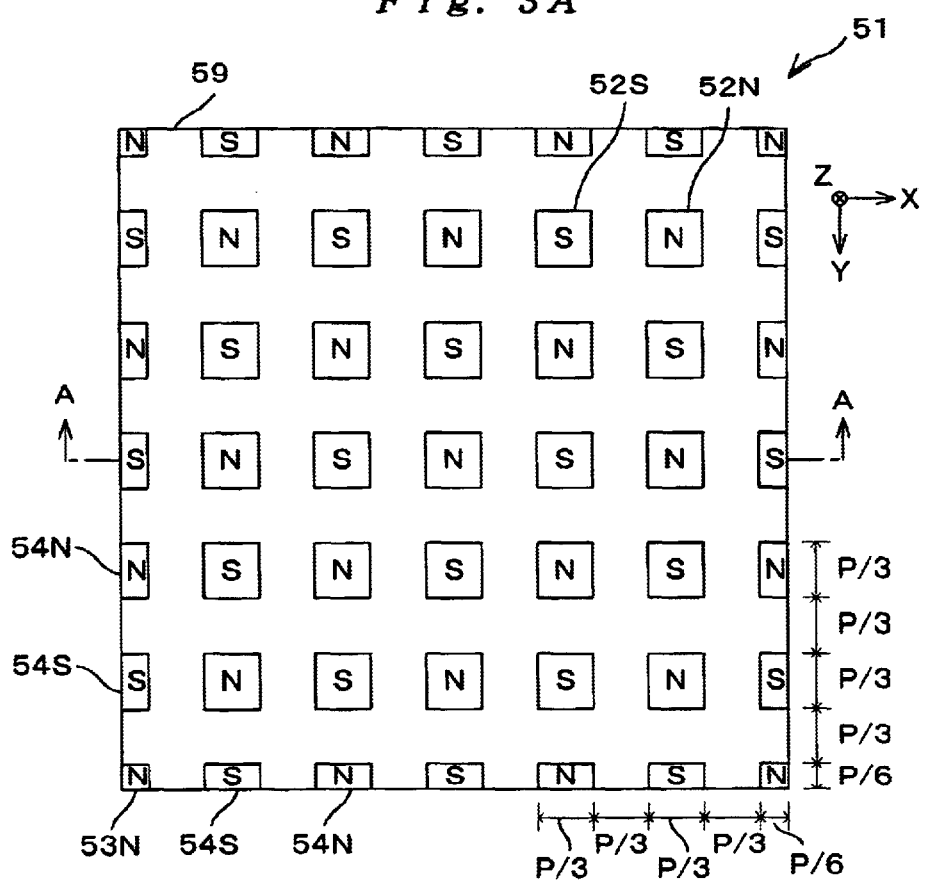
FIGS. 3A to 3C are diagrams for explaining the arrangement of a magnetic pole unit.
Figure 3B:
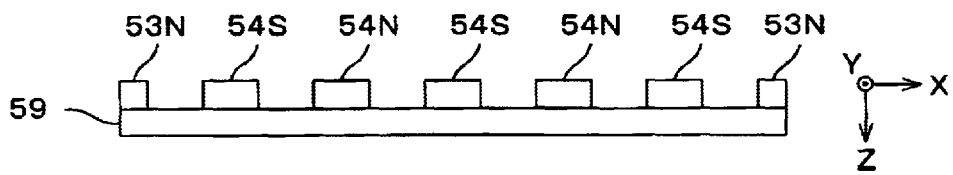
Figure 3C:
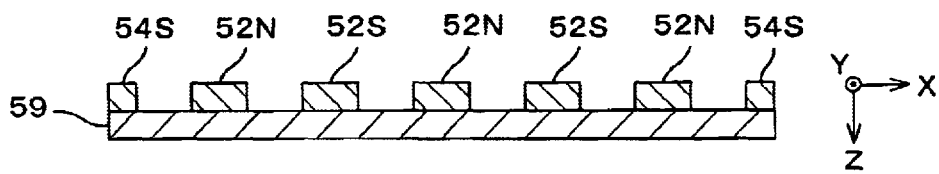

FIG. 3A shows the bottom surface of the mover 51 (a plan view seen in the −Z direction); FIG. 3B shows a side view of the mover 51 as seen in the +Y direction, and FIG. 3C shows a cross-sectional view of the mover 51 taken along a line A—A of FIG. 3A. In the mover 51 shown in these figures, permanent magnets 52N, 52S, 53N, 54N, and 54S, which generate magnetic fields, are arranged in the shape of a matrix, in a plan view, on a surface (the bottom surface of the mover 51), facing the stator 60, of a flat-plate-shaped magnetic member 59 as a magnetic holding member, and the mover 51 constitutes a magnetic pole unit as a magnetic flux generator. In the following description, this mover 51 is also referred to as magnetic pole unit 51 for the sake of convenience. The permanent magnets 52N, 53N, 54N each are a magnet of which the opposite surface to the stator 60 is magnetized as a N pole, and the permanent magnets 52S, 54S each are a magnet of which the opposite surface to the stator 60. is magnetized as a S pole. Note that in FIG. 2, the permanent magnets 52N, 52S, 53N, 54N, and 54S are represented by a plate 58.

The outline of the cross section, of an armature coil 63 described later, parallel to the X-Y plane is a square. Representing the length of one side of that square by P, the permanent magnets 52N, 52S have an almost square, magnetic pole surface with one side of length P/3, and are alternately disposed in the inner part of a magnet arrangement surface of the magnetic member 59. And the permanent magnets 53N each have an almost square, magnetic pole surface with one side of length P/6, and are arranged on the four corners of the magnet arrangement surface of the magnetic member 59. Moreover, the permanent magnets 54N, 54S have an almost rectangular magnetic pole surface with a long side of length P/3 and a short side of length P/6 and are arranged in four ends of the magnetic member 59 except for the four corners. And the permanent magnets 52N, 52S, 53N, 54N, and 54S are so arranged that each of magnetic pole surfaces thereof that are facing the stator 60 has a polarity opposite to that of such magnetic pole surfaces of adjacent permanent magnets in the X-direction and Y-direction, and the permanent magnets are spaced apart from each other by P/3 in the X-direction and Y-direction.

The magnetic pole unit 51 has an air-slider (not shown) fixed thereon, and on the upper surface, seen in FIG. 1, of the magnetic pole unit 51 the substrate table 18 is provided via a support mechanism (not shown). In the air slider, a pressured air supplied via an air tube connected thereto from a air pump (not shown) is blew towards the upper surface of the base 21, and the substrate table 18 with the magnetic pole unit 51 is levitated and supported by air-layer static pressure (so-called pressure-in-gap) between the upper surface of the base 21 and the magnetic pole unit 51 in non-contact.

The base 21 containing the stator 60, as shown in FIG. 4 being a schematic cross-sectional view thereof, comprises a container 69, rectangular in a top plan view, on the upper portion of which a two-stepped concave is formed, a flat-plate-shaped magnetic member 62 which is fitted on the lower step of this container 69 from above, near the center of the height, which is made of a magnetic material, and which serves as a coil-supporting member, and a flat-plate-shaped member 68 which is made of a non-magnetic and non-conductive material such as ceramic, and which is fitted on the container 69 so as to close the open.

On the upper surface of the magnetic member 62, a plurality of armature coils 63 are arranged as shown in FIG. 4. The flat-plate-shaped-coil module 61 as an armature unit is composed of the plurality of armature coils 63, and the stator 60 of the planar motor 50 is composed of the flat-plate-shaped-coil module 61 and the magnetic member 62. The arrangement, etc., of the armature coils 63 composing the flat-plate-shaped-coil module 61 are described later.

Incidentally, to prevent the temperature increase of the armature coils 63 and other members around them and the variation of the ambient atmosphere of the armature coils 63, which are caused by heat-generation due to current supplies to the armature coils 63, in this embodiment the armature coils 63 are cooled down. The cooling-down is realized by making a closed space surrounded by the flat-plate-shaped member 68, the container 69 and the magnetic member 62 be a path of a coolant for cooling down the armature coils 63 of the flat-plate-shaped-coil module 61. That is, an inlet opening (not shown) is made on one side of the closed space and an outlet opening (not shown) is made on another side of the closed space. A coolant (for example, water or FLUORINERT (product name)) is sent into the closed space through the inlet opening from a cooling control mechanism (not shown), passes through the closed space performing heat-exchange with the flat-plate-shaped-coil module 61 and absorbing heat generated in the flat-plate-shaped-coil module 61, and is sent out of the outlet opening.

Figure 5A:
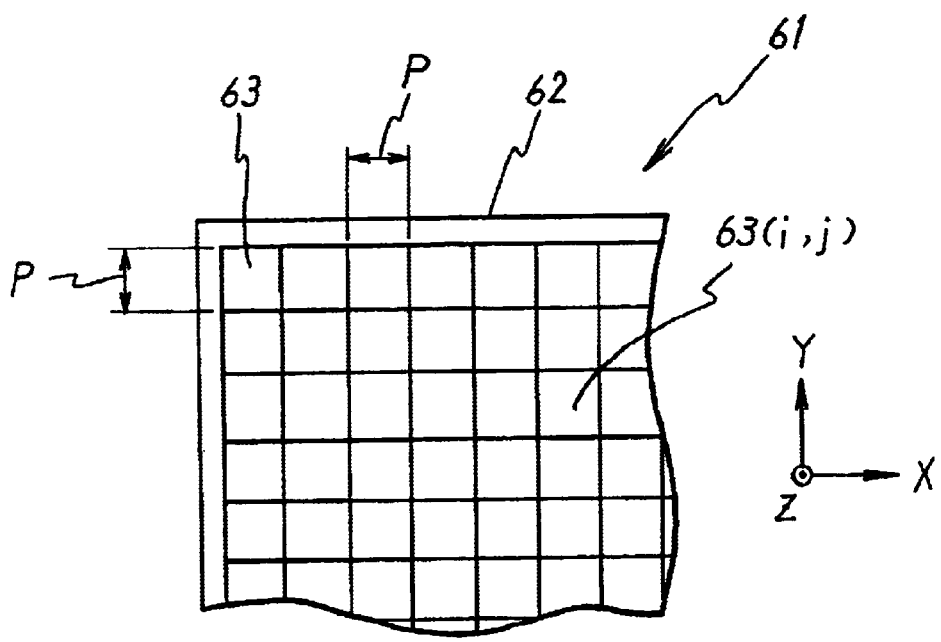
FIGS. 5A and 5B are diagrams for explaining the arrangement of a flat-plate-shaped-coil module.
Figure 5B:
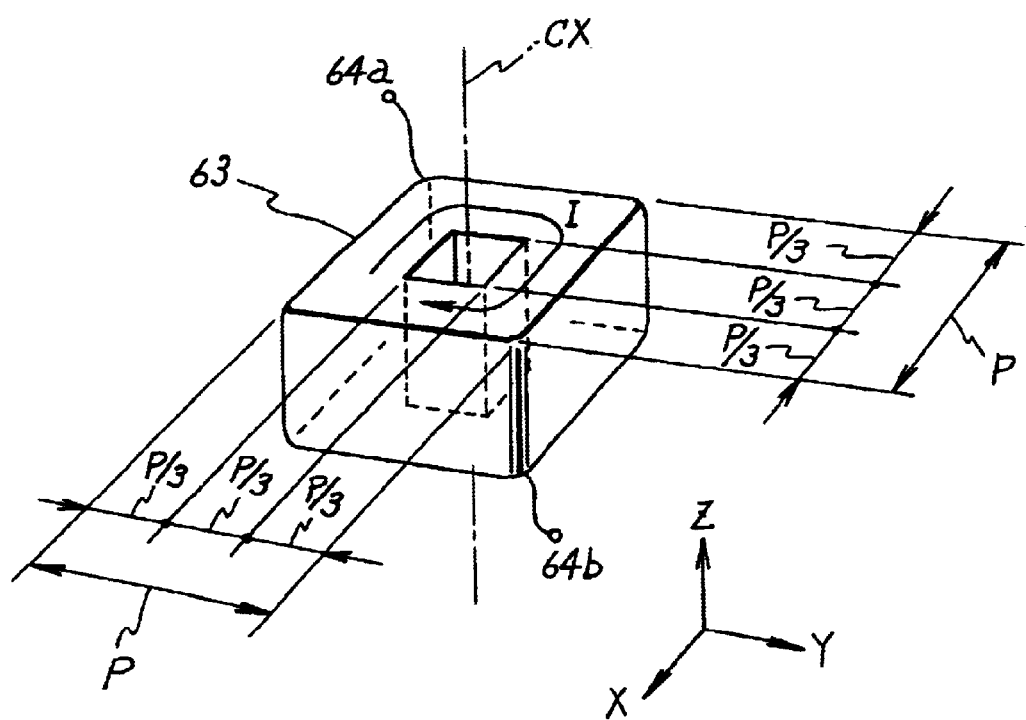

The flat-plate-shaped-coil module 61 is composed of a plurality of the armature coils 63 arranged in the shape of a matrix as shown in FIG. 5A. Note that in the following description, an expression 63(i,j) represents an individual armature coil 63, and the expression of an armature coil 63 represents any of the armature coils. An armature coil 63 is, as shown in FIG. 5B, a hollow cylinder having an almost square, bottom surface with one side of length P, which surface is parallel to the X-Y plane, and having a hole extending in the Z-direction around the center axis CX parallel to the Z-axis. The cross section of the hole has the shape of a square with one side of length P/3. The electric-current driving unit 22 supplies a current via terminals 64a and 64b to the armature coil 63 and the current flows in almost uniform current density in the armature coil 63 around the center axis CX. It is noted that the value and direction of the current flowing the armature coil 63 is controlled via the electric-current driving unit 22 by the stage control system 19.

In the exposure apparatus 100 in FIG. 1, on the substrate table 18, a reference mark plate (not shown) is fixed on which various kinds of reference marks for the base-line measurement to measure the distance between the detection center of an alignment-detection system (not shown) of the off-axis method and the optical axis of the projection optical system PL are formed.

Furthermore, the exposure apparatus 100, shown in FIG. 1, comprises a multi-point focal position detection system (not shown) which is one of focus detection systems (or focal point detection systems) of the oblique incidence method, and which is for detecting positions, in the Z direction (optical axis AX direction), of the exposure area IA and its adjacent areas on the surface of the wafer W. The multi-point focal position detection system comprises an illumination optical system and a light receiving system (none are shown). The detailed arrangement of the multi-point focal position detection system is disclosed in, for example, Japanese Patent Laid-Open No. 6-283403 and U.S. Pat. No. 5,448,332 corresponding thereto. The disclosures in the above Japanese Patent Laid-Open and U.S. Patent are incorporated herein by reference as long as the national laws in designated states or elected states, to which this international application is applied, permit.

Figure 6:
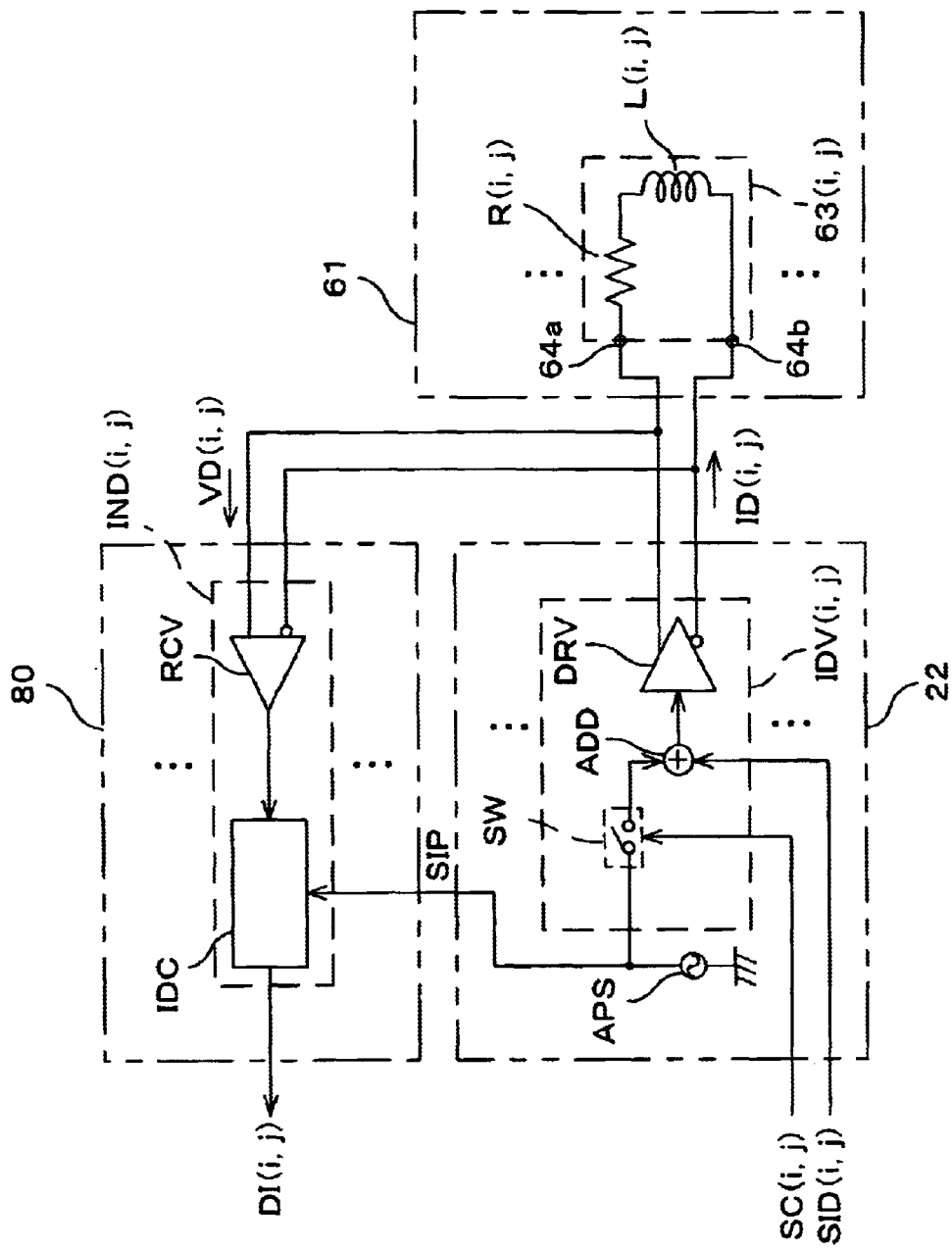
FIG. 6 is a view for explaining the arrangement of circuits of a inductance measurement unit and electric current driving unit.

Referring back to FIG. 1, the exposure apparatus 100 of the present embodiment comprises an inductance measurement unit 80 to measure the inductance of all armature coils 63. The inductance measurement unit 80 comprises an inductance measurement circuit IND(i,j) for an armature coil 63(i,j) as shown in FIG. 6. And the inductance measurement circuit IND(i,j) has a receiving circuit RCV and an inductance detection circuit IDC.

Furthermore, FIG. 6 shows the circuit structure of a current driving unit 22 and an equivalent circuit of an armature coil 63(i,j). That is, the current driving unit 22 comprises a high-frequency-alternating power supply APS, and a current driving circuit IDV(i,j) for the armature coil 63(i,j), and the current driving circuit IDV(i,j) has a switch circuit SW, an adder ADD, and a driving circuit DRV.

The switch circuit SW is opened and closed according to a switch control signal SC(i,j) from the stage control system 19, and controls whether or not an output signal from the high-frequency-alternating power supply APS is supplied to the adder ADD. In FIG. 1, the switch control signal SC(i,j) is represented by "SC". And the adder ADD calculates the result of adding the output signal of the switch circuit SW and a driving-current-specifying signal SID(i,j) from the stage control system 19, which is represented by "SID" in FIG. 1. An electric current ID(i,j) according to the adding result is supplied via the driving circuit DRV to the armature coil 63(i,j). The electric current ID(i,j) is represented by "ID" in FIG. 1. It is noted that the angular frequency $\omega_H$ of the output signal of the high frequency alternating power supply APS is set to be high enough not to contribute to the driving of the substrate table 18 in practice.

Furthermore, as shown in FIG. 6, the armature coil 63(i,j) can be represented by an equivalent circuit where an inner resistance R(i,j) and an inductance L(i,j) are connected in series.

The action of elements, shown in FIG. 6, in supplying a stage driving current to the armature coil 63(i,j) and measuring the inductance of the armature coil 63(i,j) will be described in the below.

When not performing the inductance measurement, the stage control system 19 turns off the switch circuit SW by the switch control signal SC(i,j). Then, upon supplying a stage driving current to the armature coil 63(i,j), when the driving-current-specifying signal SID(i,j) is supplied from the stage control system 19, the driving-current-specifying signal SID(i,j) is inputted into the driving circuit DRV via the adder ADD. And the driving circuit DRV supplies the current ID(i,j) in accordance with the driving-current-specifying signal SID(i,j) to the armature coil 63(i,j).

On the other hand, in measuring the inductance, the stage control system 19 turns on the switch circuit SW by the switch control signal SC(i,j). As a result, the output signal of the high-frequency-alternating power supply APS is inputted into the adder ADD, and the adder ADD outputs a signal in which the output signal of the high frequency alternating power supply APS is superposed on the driving-current-designation signal SID(i,j). And the driving circuit DRV supplies a current in accordance with the output signal of the adder ADD to the armature coil 63(i,j). Note that the angular frequency $\omega_H$ of the output signal of the high-frequency-alternating power supply APS is high enough not to contribute to the driving of the substrate table 18 in practice.

Assume that the output signal SIP of the high frequency alternating power supply APS is given by $$SIP = B \cdot \sin(\omega_H \cdot t) \tag{1}$$

Then, an electric current IDP according to the signal SIP, which IDP is supplied to the armature coil 63(i,j), is given by $$IDP = C \cdot \sin(\omega_H \cdot t) \tag{2}$$

where B and C are constants and t represents time.

Then, by supplying IDP(i,j), a voltage VDP(i,j) between the current terminals 64a and 64b of the armature coil 63(i,j) is given by $$VDP(i,j) = C \cdot R(i,j) \cdot \sin(\omega_H \cdot t) + C \cdot L(i,j) \cdot \omega_H \cdot \cos(\omega_H \cdot t) \tag{3}$$

Although an actual voltage VD(i,j) between the current terminals 64a and 64b of the armature coil 63(i,j) is given by adding a voltage, generated by a supply-current in accordance with the driving-current-specifying signal SID(i,j), to VDP(i,j) given by the equation (3), no voltage-component other than the voltage VDP(i,j) has an angular frequency close to $\omega_H$. The voltage VD(i,j) is represented by "VD" in FIG. 1. Note that when the driving-current-specifying signal SID(i,j) instructs that the driving current be zero, the actual voltage VD(i,j) between the current terminals 64a and 64b of the armature coil 63(i,j) becomes equal to VDP(i,j).

The voltage VD(i,j) is supplied to the receiving circuit RCV of the inductance measurement circuit IND(i,j) as shown in FIG. 6, and an output signal, of the receiving circuit RCV, according to the voltage VD(i,j) is inputted into the inductance detection circuit IDC.

The inductance detection circuit IDC takes out a signal component SDP in accord with the voltage VDP(i,j) by filtering the input signal (for example, by using a high-pass filter). The signal is given by $$SDP(i,j)=D\cdot R(i,j)\cdot \sin(\omega_H\cdot t)+D\cdot L(i,j)\cdot \omega_H\cdot \cos(\omega_H\cdot t) \quad (4),$$

where D is a known constant.

Next, the inductance detection circuit IDC removes a component, having the same phase as the signal SIP supplied by the current driving circuit IDV(i,j), from the signal SDP(i,j), extracts the second term $(D\cdot L(i,j)\cdot \omega_H\cdot \cos(\omega_H\cdot t))$ in the right side of the equation (4), and detects the inductance L(i,j) of the armature coil 63(i,j). And the detection result DI(i,j) (represented by "DI" in FIG. 1) is sent to the main controller 20 via the stage control system 19.

Figure 7A:
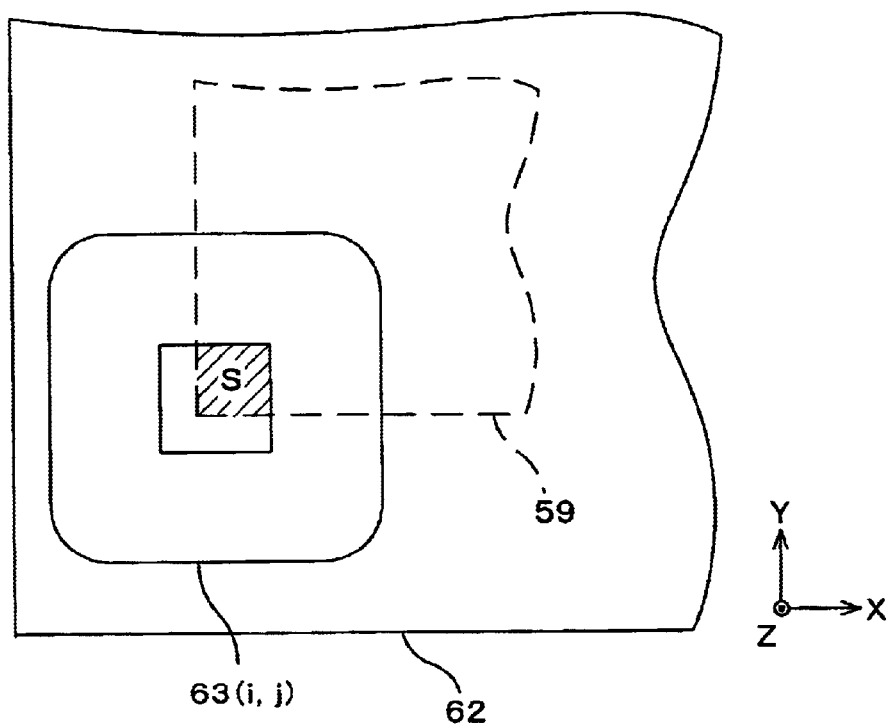
FIGS. 7A and 7B are diagrams for explaining an inductance of an armature coil.

Because the magnetic pole unit 51 comprises a magnetic member 59 having far larger permeability $\mu_M$ than permeability $\mu_0$ of the air, the magnetic flux $\phi$ accompanying a magnetic field H, which is induced inside the armature coil 63(i,j) by supplied current I, varies according to the positional relation between the magnetic member 59 and the armature coil 63(i,j). For example, as shown in FIG. 7A, representing by S the area of a magnetic member 59, which area covers the hole of the armature coil 63(i,j) in a plan view, the magnetic flux $\phi$ is given by $$\phi \approx \mu_0\cdot H\cdot S\cdot f(\mu_M) \quad (5),$$

where $f(\mu_M)$ is a function of permeability $\mu_M$. The larger the permeability $\mu_M$ is, the larger the value of $f(\mu_M)$ is. Although, needless to say, part of the magnetic flux exists in the portion of the hole of the armature coil 63(i,j), which portion is not covered by the magnetic member 59 in the plan view, because $$f(\mu_M) \geq f(\mu_0) \quad (6),$$

the equation (5) appropriately represents the whole magnetic flux.

Figure 7B:
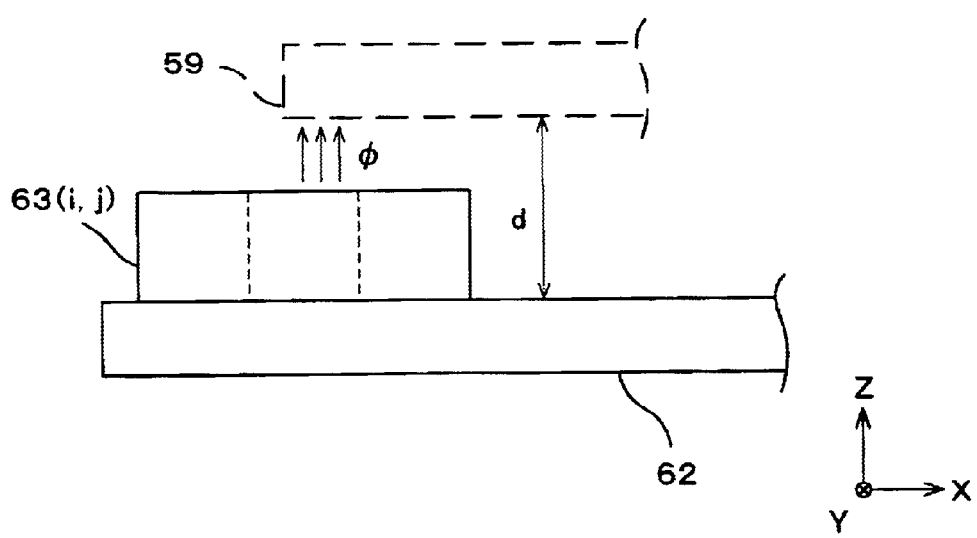

Moreover, the magnetomotive force F of the armature coil 63(i,j) is given by the following equation using the number N of turns of coil and supplied current I, or the generated magnetic field H and the size d of the gap between the magnetic members 62 and 59, as shown in FIG. 7B:

$$f=N\cdot I=H\cdot d \quad (7).$$

Note that, because of the levitation described above, the size d of the gap is almost constant.

Furthermore, the inductance L(i,j) of the armature coil 63(i,j) is generally given by $$L(i,j)=N\cdot \phi/I \quad (8),$$

thus $$L(i,j) \approx \mu_0\cdot N^2\cdot S\cdot f(\mu_M)/d \quad (9).$$

That is, the value of the inductance L(i,j) of the armature coil 63(i,j) is considered to be proportional to the size S of the area of the magnetic member 59, which area covers the hole of the armature coil 63(i,j) in a plan view.

Therefore, by measuring the inductance L(i,j) of the armature coil 63(i,j) in the above manner, information regarding the positional relation between the magnetic member 59 and the armature coil 63(i,j) can be obtained. This information will be described later.

The action of those elements of the present embodiment when a wafer W is moved will be described in the below. First, the movement of the wafer W in this embodiment, that is, the outline of the principle of driving the magnetic pole unit 51 as the mover of the planar motor 50 will be described.

Figure 8A:
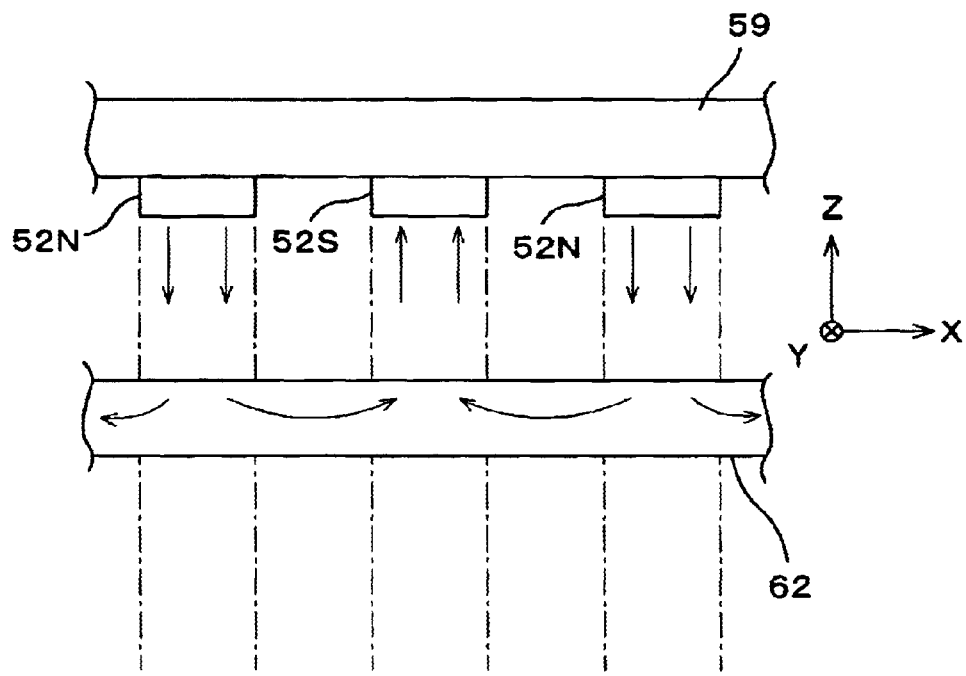
FIGS. 8A and 8B are diagrams for explaining magnetic circuits concerning the magnetic pole unit.

In the magnetic pole unit 51, as shown by solid arrows in FIG. 8A taking as an example the permanent magnets 52N and 52S and illustrating the principle, the permanent magnets 52N, 53N, 54N generate magnetic fluxes in the (−Z) direction (downwards in the figure) and the permanent magnets 52S, 53S, 54S generate magnetic fluxes in the (+Z) direction (upwards in the figure). And these permanent magnets compose magnetic circuits together with the magnetic members 59 and 62.

Magnetic circuits related to the permanent magnets 52N, 52S will be described as an example in the below.

Figure 8B:
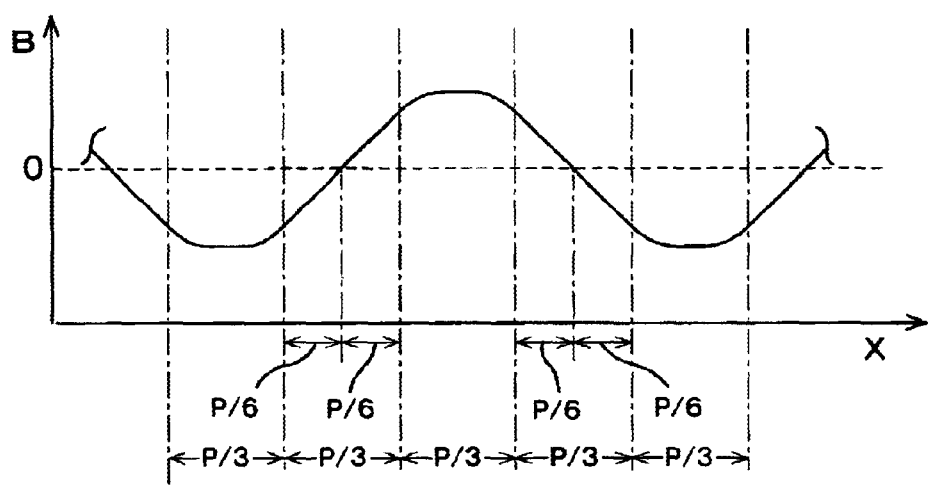

In magnetic circuits shown in FIG. 8A, a magnetic flux density B near the magneticmember 62, i.e. in the Z-position where the flat-plate-shaped-coil module 61 is placed, has a distribution shown in FIG. 8B. That is, the absolute value of the magnetic flux density B is maximal in positions corresponding to the center points of the permanent magnets 52N, 52S, decreases as going from the center points to the periphery of the permanent magnets 52N, 52S, and becomes zero at the middle between the position corresponding to the center point of the permanent magnet 52N and the position corresponding to the center point of the permanent magnet 52S. Furthermore, the distribution of the magnetic flux density B is symmetric with respect to the (±)X-direction with the positions corresponding to the center points of the permanent magnets 52N, 52S as centers. That is, the X-directional distribution of the magnetic flux density B has such a shape as can be approximated by a sine function. Note that in FIG. 8B, when the magnetic flux is in the (+Z) direction, the value of the magnetic flux density B is positive, and when the magnetic flux is in the (−Z) direction, the value of the magnetic flux density B is negative. Furthermore, the Y-directional distribution of the magnetic flux density B is the same as the X-directional distribution shown in FIG. 8B.

Note that because in the present embodiment, stainless or the like which has high resistance, high saturation magnetic flux density, low magnetic hysteresis, and low coercive force is used as a material of magnetic members, it is possible to reduce eddy currents, hysteresis losses, and magnetic resistance and to successively generate magnetic flux having high magnetic flux density even when the magnetic pole unit 51 is moving.

With the magnetic flux density B having the distribution shown in FIG. 8B, when electric currents are supplied to the armature coils 63, Lorentz forces are generated in the armature coils 63. Then reactions to the Lorentz forces are exerted on the magnetic pole unit 51, and by that, the substrate table 18 with the wafer W is moved. Note that the magnitude and direction of each Lorentz force vary according to the amplitude and direction of a current supplied to a respective armature coil 63 and the positional relation between the magnetic pole unit 51 and the flat-plate-shaped-coil module 61. In this embodiment, when moving the substrate table 18 in the X-direction, the X-component of the resultant force of Lorentz forces is controlled to be constant independently of the X-position of the magnetic pole unit 51 by selecting pairs of armature coils 63, which coils are adjacent to each other in the X-direction, according to the X-position of the magnetic pole unit 51 and supplying to each of the pairs of armature coils 63 sine-wave currents which are according to the positional relation between the magnetic pole unit 51 and the flat-plate-shaped-coil module 61, which are different from each other by 90 degrees in phase, and which have the same amplitude. It is also noted that by supplying currents to drive the magnetic pole unit 51 in the X-direction, generally, a force to drive the magnetic pole unit 51 in the Y-direction and a torque about the Z-axis are generated. In this embodiment the currents are so controlled that the force to drive the magnetic pole unit 51 in the Y-direction and the torque about the Z-axis become zero as a whole. Moreover, the magnitude and direction of the force to drive the magnetic pole unit 51 can be controlled by controlling the amplitude and direction of the sine-wave current supplied to each armature coil.

In addition, when driving the magnetic pole unit 51 in the Y-direction to move the magnetic pole unit 51 in the Y-direction, in the same manner as in the X-direction, the magnetic pole unit 51 is driven by a constant driving force independent of the Y-position of the magnetic pole unit 51.

Furthermore, by supplying to each armature coil 63 a current in which a current-waveform for driving the magnetic pole unit 51 in the X-direction is superposed on a current-waveform for driving in the Y-direction at an appropriate rate, the magnetic pole unit 51 can be driven in any direction on the X-Y plane by any driving force amount.

Furthermore, by driving the magnetic pole unit 51 without canceling the torque, the magnetic pole unit 51 can be rotated in a desired direction by a desired torque.

As described above, in the exposure apparatus 100 of the present embodiment, by controlling the current supplied to the armature coil 63 according to the X-Y position and yaw (rotation about the Z-axis) θ of the substrate table 18, the position of the substrate table 18 and thus the position of the wafer W is controlled.

Next, the flow of the operation of controlling the position of the wafer W will be described with reference to a flow-chart shown in FIG. 10 and other figures as the need arises.

In the exposure apparatus 100 of the present embodiment, as shown in FIG. 9A, wafer interferometers 31X1, 31X2, 31Y receive laser beams, which are emitted by wafer interferometers 31X1, 31X2, 31Y respectively and reflected by movable mirrors 27X, 27Y. That is, when the X-Y position and yaw 6 of the substrate table 18 can be detected by the wafer interferometers 31X1, 31X2, 31Y, in step 201a of FIG. 10 the main controller 20 controls the position of the substrate table 18 via the stage control system 19 and the current driving unit 22 based on the X-Y position and yaw e of the substrate table 18 detected by the wafer interferometers 31X1, 31X2, 31Y. The wafer interferometers 31X1, 31X2, 31Y are represented by a "wafer interferometer 31" in FIG. 10.

Next, in a step 201b, via the stage control system 19, the main controller 20 judges whether or not the X-Y position and yaw θ of the substrate table 18 can be detected by the wafer interferometers 31X1, 31X2, 31Y.

If the answer in the step 201b is YES, in a step 201c the main controller 20 judges whether the exposure operation is completed or not. If, in the step 201c, it is judged that the exposure operation is completed, the position control of the substrate table 18 ends. On the other hand, if, in the step 201c, it is judged that the exposure operation is not completed, the sequence returns to the step 201a and the main controller 20 continues to control the position of the substrate table 18 via the stage control system 19 and the current driving unit 22 based on the X-Y position and yaw θ of the substrate table 18 detected by the wafer interferometers 31X1, 31X2, 31Y.

In this manner, if the X-Y position and yaw θ of the substrate table 18 can be detected by the wafer interferometers 31X1, 31X2, 31Y, the step 201a through step 201c are repeatedly executed and the position of the substrate table 18 is controlled based on the X-Y position and yaw θ of the substrate table 18 detected by the wafer interferometers 31X1, 31X2, 31Y.

Figure 10:
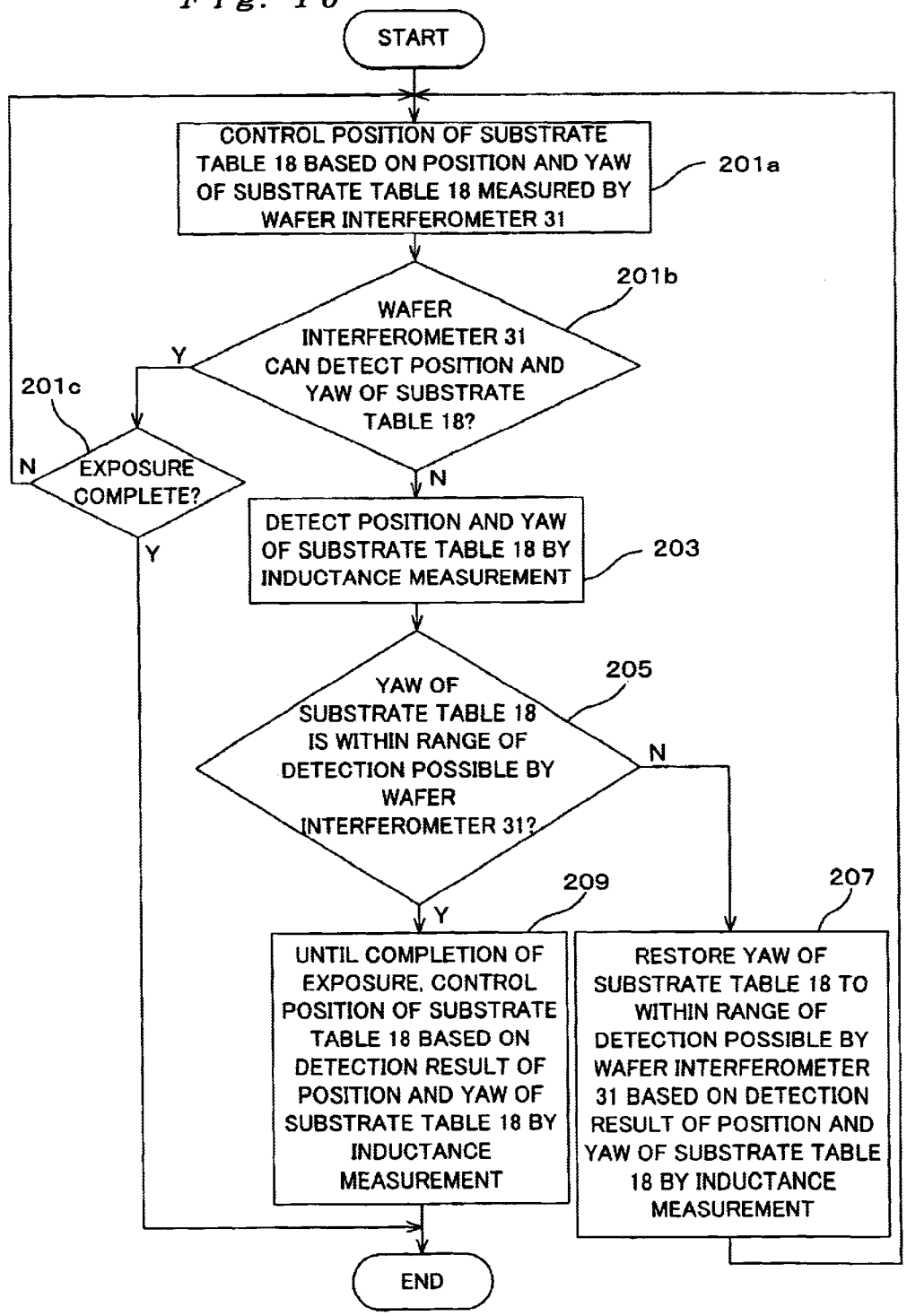
FIG. 10 is a flow chart for explaining execution of controlling the position of the substrate table in an embodiment of this invention.

On the other hand, in a case where the X-Y position and yaw θ of the substrate table 18 greatly change due to malfunction of the planar motor 50 or external disturbance and where, as shown in FIG. 9B, the wafer interferometers 31X1, 31X2, 31Y cannot receive laser beams that are emitted by wafer interferometers 31X1, 31X2, 31Y and reflected by movable mirrors 27X, 27Y, that is the X-Y position and yaw θ of the substrate table 18 cannot be detected by the wafer interferometers 31X1, 31X2, 31Y, the answer in the step 201b of FIG. 10 is NO, and the sequence advances to a step 203. It is noted that also when the wafer interferometers 31X1, 31X2, 31Y are out of order, the answer in the step 201b is NO, and that the sequence advances to the step 203.

Incidentally, if the event that it has become impossible to detect the X-Y position and yaw θ of the substrate table 18 by the wafer interferometers 31X1, 31X2, 31Y is a cause for interruption, and the sequence advances to the step 203 upon the occurrence of that interruption, the step 201b can be omitted.

In the step 203, under the control by the main controller 20, the X-Y position and yaw θ of the substrate table 18 is detected by measuring the inductances of the armature coils 63 in the following manner:

First, the main controller 20 temporarily switches off the switch circuits SW of all current driving circuits IDV(i,j) of the inductance measurement unit 80 via the stage control system 19 and the current driving unit 22, and collects measurement results DI(i,j) of the inductances L(i,j) measured by inductance measurement circuits (i,j) of the inductance measurement unit 80.

Figure 11:
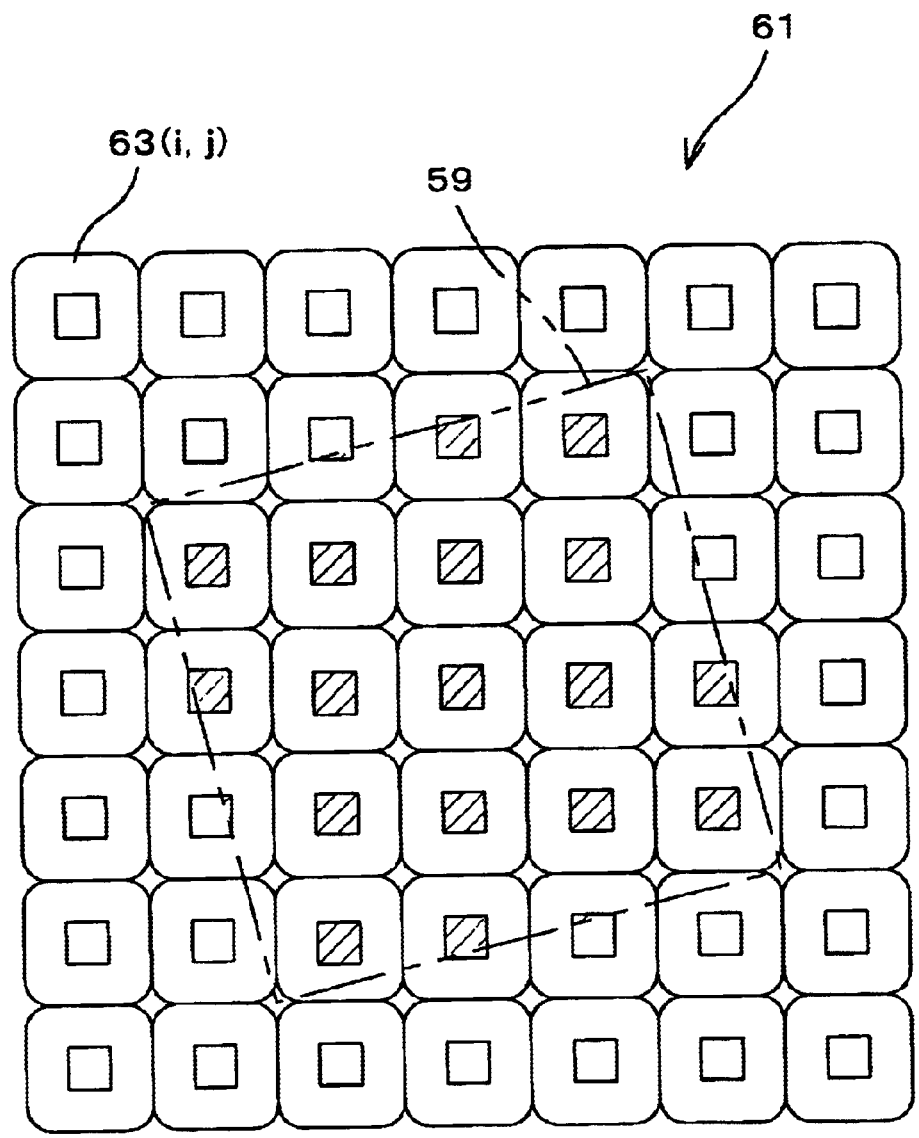
FIG. 11 is a diagram illustrating an example of the positional relation between the magnetic pole unit and an armature unit.

It is assumed that upon these measurements, the positional relation between the flat-plate-shaped-coil module 61 and the magnetic member 59 is like one shown in FIG. 11. Note that in FIG. 11 the areas of the holes of armature coils 63, which areas are covered by the magnetic member 59 in a plan view, is indicated by hatching. In this case, the measured value of the inductance L(i,j) of an armature coil 63(i,j) is proportional to the size of the area of the hole of the armature coil 63(i,j)i which area is covered by the magnetic member 59 in a plan view, as shown in FIG. 12. Note that in FIG. 12 the inductance of an armature coil 63(i,j) of which the entire hole is covered by the magnetic member 59 in a plan view is set to 1, and that the measured value of inductance L(i,j) of each armature coil 63(i,j) is represented as 1 or smaller.

Next, the main controller 20 detects the X-Y position and yaw θ of the magnetic member 59, that is the substrate table 18, based on the measured value of inductance L(i,j) of each armature coil 63(i,j), and based on the shape of the magnetic member 59 and the shape and arrangement of the holes of the armature coils 63. In that detection, the main controller 20 may analytically calculate the X-Y position and yaw θ of the substrate table 18, or refer to a table made beforehand of which each entry represents the relation between a pattern of measured values of inductances L(i,j) of the armature coils 63 and corresponding X-Y position, and yaw θ, of the substrate table 18.

Next, referring back to FIG. 10, in a step 205, based on the value of the yaw θ detected in the step 203, the main controller 20 judges whether or not the yaw θ of the substrate table 18 is within the range of detection possible by the wafer interferometers 31X1, 31X2, 31Y. That is, the main controller 20 judges whether the cause of the wafer interferometers 31X1, 31X2, 31Y not being able to detect the X-Y position and yaw θ of the substrate table 18 is the large variation of the yaw θ of the substrate table 18 due to malfunction of the planar motor 50 or external disturbance, or whether the wafer interferometers 31X1, 31X2, 31Y are out of order.

If in the step 205 the answer is NO, the main controller 20 judges that the cause of the wafer interferometers 31X1, 31X2, 31Y not being able to detect the X-Y position and yaw θ of the substrate table 18 is the large variation of the yaw θ of the substrate table 18 due to malfunction of the planar motor 50 or external disturbance. And in step 207, the main controller 20 returns the yaw θ of the substrate table 18 to within the range of the detection of the X-Y position and yaw θ of the substrate table by the wafer interferometers 31X1, 31X2, 31Y. Specifically, the main controller 20 rotates the substrate table 18 about the Z-axis, with fixing its gravity center, via the stage control system 19 and the current driving unit 22, while detecting the X-Y position and yaw θ of the substrate table 18 by inductance measurements as described in step 203.

In this manner, after the yaw θ of the substrate table 18 is returned to within the range of the detection of the X-Y position and yaw θ of the substrate table 18 by the wafer interferometers 31X1, 31X2, 31Y, the sequence advances to the step 201a. After that, as described above, the main controller 20 controls the position of the substrate table 18 based on the X-Y position and yaw θ of the substrate table 18, which are detected by the wafer interferometers 31X1, 31X2, 31Y, via the stage control system 19 and the current driving unit 22. It is noted that after the restoration of the yaw the main controller 20 may continue to control the position of the substrate table 18 from the state in which the substrate table 18 was when the position control was suspended, and which was detected by the wafer interferometers 31X1, 31X2, 31Y, or may move the substrate table 18 to an initial position.

Meanwhile, if the answer in the step 205 is YES, the main controller 20 judges that the cause of the wafer interferometers 31X1, 31X2, 31Y not being able to detect the X-Y position and yaw θ of the substrate table 18 is their being out of order. And in a step 209, until the completion of the exposure operation, the main controller 20 detects the X-Y position and yaw θ of the substrate table 18 by inductance measurements and controls the position of the substrate table 18 via the stage control system 19 and the current driving unit 22.

The flow of the exposure operation that the exposure apparatus 100 of this embodiment performs while controlling the position of the substrate table 18 and the wafer W in the manner described above will be briefly described in the below.

First, a reticle R having a pattern formed thereon is loaded onto the reticle stage RST by a reticle loader (not shown). Similarly, a wafer W is loaded onto the substrate table 18 by a wafer loader (not shown).

At this time, the substrate table 18 is supported by air levitation at a predetermined wafer loading position above the base 21. The main controller 20 controls the position of the substrate table 18 via the stage system 19 on the basis of a servo-mechanism such that the substrate table 18 stays at the loading position for a predetermined period of time. While the substrate table 18 stays at the loading position, electric currents are supplied to the armature coils 63 of the stator 60 of the planar motor 50, and the main controller 20 cools down the armature coils 63 via a cooling unit, etc., so as to prevent the temperature of the armature coils 63 from rising due to the generated heat.

Next, after the main controller 20 makes preparations such as a reticle alignment and a base-line measurement in a predetermined procedure by using a reticle microscope (not shown), a reference mark plate (not shown) mounted on the substrate table 18 and an alignment detection system (not shown), alignment measurement such as EGA (Enhanced Global Alignment), which uses a statistic method, is performed by using the alignment detection system. The details of the EGA measurement are disclosed, for example, in Japanese Patent Laid-Open No. 61-44429 and U.S. Pat. No. 4,780,617 corresponding thereto, and in Japanese Patent Laid-Open No. 2-54103 and U.S. Pat. No. 4,962,318 corresponding thereto. In the EGA-measurement, arrangement coordinates of shot areas SA on a wafer are calculated by using a statistic process. The disclosures in the above Japanese Patent Laid-Opens and U.S. Patents are incorporated herein by reference as long as the national laws in designated states or elected states, to which this international application is applied, permit.

After the completion of the alignment measurement, an exposure operation of the step-and-scan method is performed in the following manner.

Upon exposure, first of all, the substrate table 18 is moved so that the first shot area (first shot) of the wafer W is positioned at a scanning starting position. This movement is performed by the main controller 20 controlling a current supplied to each of the armature coils 63 composing the planar motor 50 via the stage control system 19, as described above. Simultaneously, the reticle stage RST is moved so that the reticle is positioned at a scanning starting position. This movement is performed by the main controller 20 via the stage control system 19 and a reticle driving portion (not shown).

Then, the stage control system 19 synchronously moves the reticle R and the wafer W via the reticle driving portion (not shown) and the planar motor 50 based on the X-Y position information of the reticle R measured by the reticle interferometer 16 and the X-Y position information of the wafer W, measured in the above manner. During the synchronous movements, as shown in FIG. 13, the reticle R is illuminated in a rectangular (slit-shaped) illumination area IAR of which the longitudinal direction is perpendicular to the scanning direction (Y-axis direction) of the reticle R, and the reticle R is scanned at a velocity $V_R$ in the (−Y) direction upon exposure. The illumination area IAR (the center of which almost coincides with the optical axis AX) is projected onto the wafer W via the projection optical system PL, and A slit-shaped projection area that is conjugate to the illumination area IAR, i.e. an exposure area IA, is formed on the wafer. Because the wafer W and the reticle R are in the relation of an inverted image, the wafer W is thus scanned at a velocity Vw synchronously with the reticle R in the direction (+Y direction) opposite to the direction of the velocity $V_R$, and the entire area of a shot area SA on the wafer W is exposed. The ratio $V_W/V_R$ of the scanning velocities accurately corresponds to the reduction ratio of the projection optical system PL, and the pattern of a pattern area PA of the reticle R is accurately reduced and transferred onto a shot area SA on the wafer W. Note that the width in the longitudinal direction of the illumination area IAR is set to be wider than that of the pattern area PA on the reticle R and narrower than the maximum width of a shielding area ST, and that by scanning the reticle R, the entire pattern area PA is illuminated.

After transferring the reticle pattern onto a shot area by the above scanning exposure is completed, the substrate table 18 is moved by stepping, and the scanning exposure is performed on a next shot area. In this way, the stepping and scanning-exposure are repeated, and the pattern is transferred onto the wafer W a necessary number of times, corresponding to the number of shot areas.

Because the exposure apparatus 100 of the present embodiment can detect the X-Y position and yaw θ of the substrate table 18 all the time and successively control the position of the substrate table 18 regardless of the yaw θ of the substrate table 18. Accordingly, the through-put of exposure is improved.

The exposure apparatus 100 of this embodiment can be made by fitting together the reticle stage RST comprising plenty of mechanical elements, the projection optical system PL comprising a plurality of lenses, etc., and assembling the stage unit 30 by fitting other elements on the base 21, and then performing comprehensive adjustment (including electrical adjustment, optical adjustment, function confirmation).

Incidentally, it is preferred that the making of the exposure apparatus 100 is performed in a clean room where the temperature, the degree of cleanness, etc., are controlled.

Next, the manufacture of devices by using the above exposure apparatus and method will be described.

Figure 14:
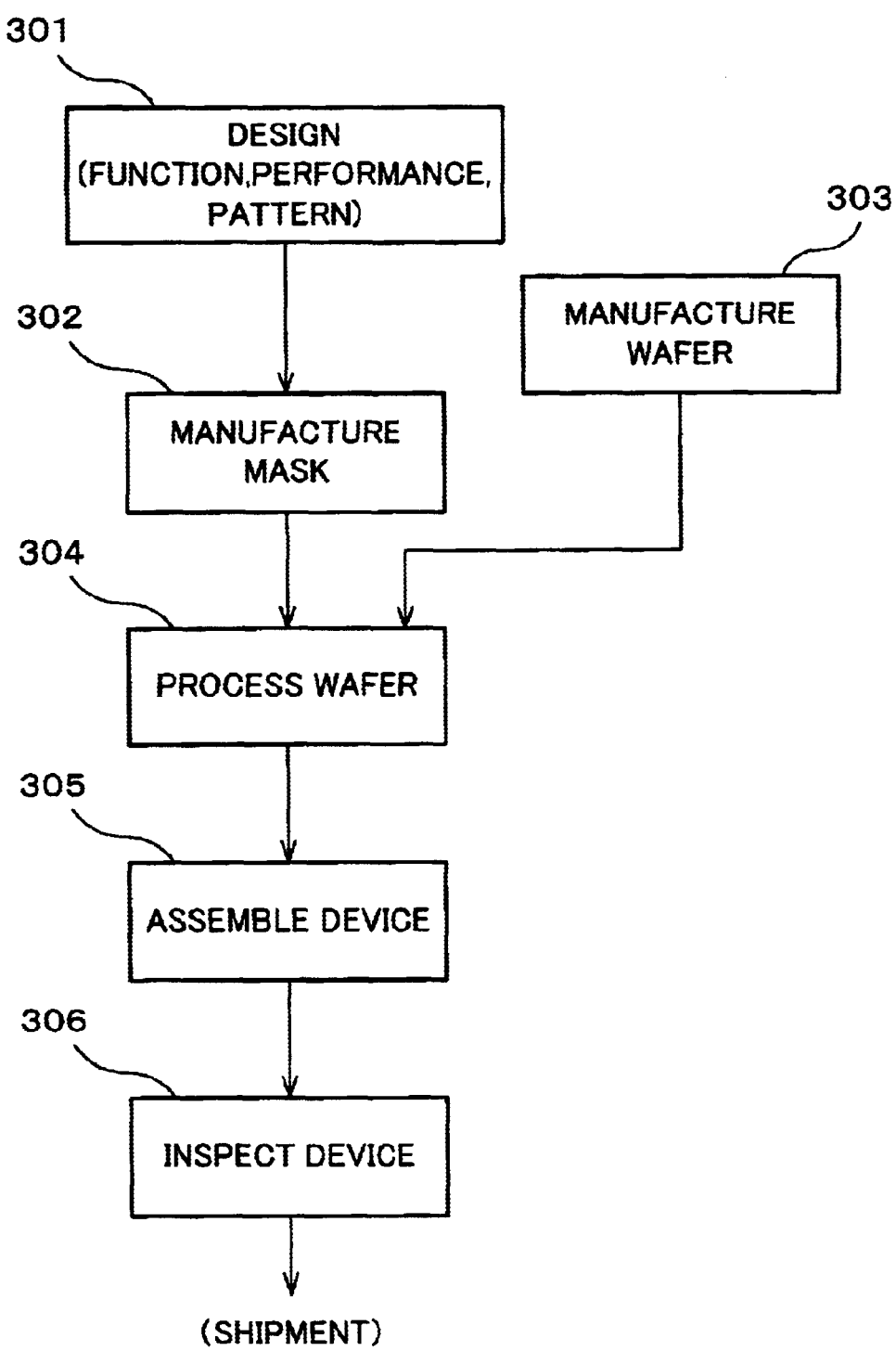
FIG. 14 is a flow chart for explaining a device manufacturing method using the exposure apparatus in FIG. 1.

FIG. 14 is a flow chart for the manufacture of devices (semiconductor chips such as IC or LSI, liquid crystal panels, CCD's, thin magnetic heads, micro machines, or the like) in this embodiment. As shown in FIG. 14, in step 301 (design step), function/performance design for the devices (e.g., circuit design for semiconductor devices) is performed and pattern design is performed to implement the function. In step 302 (mask manufacturing step), masks on which a different sub-pattern of the designed circuit is formed are produced. In step 303 (wafer manufacturing step), wafers are manufactured by using silicon material or the like.

In step 304 (wafer processing step), actual circuits and the like are formed on the wafers by lithography or the like using the masks and the wafers prepared in steps 301 through 303, as will be described later. In step 305 (device assembly step), the devices are assembled from the wafers processed in step 304. Step 305 includes processes such as dicing, bonding, and packaging (chip encapsulation).

Finally, in step 306 (inspection step), a test on the operation of each of the devices, durability test, and the like are performed. After these steps, the process ends and the devices are shipped out.

Figure 15:
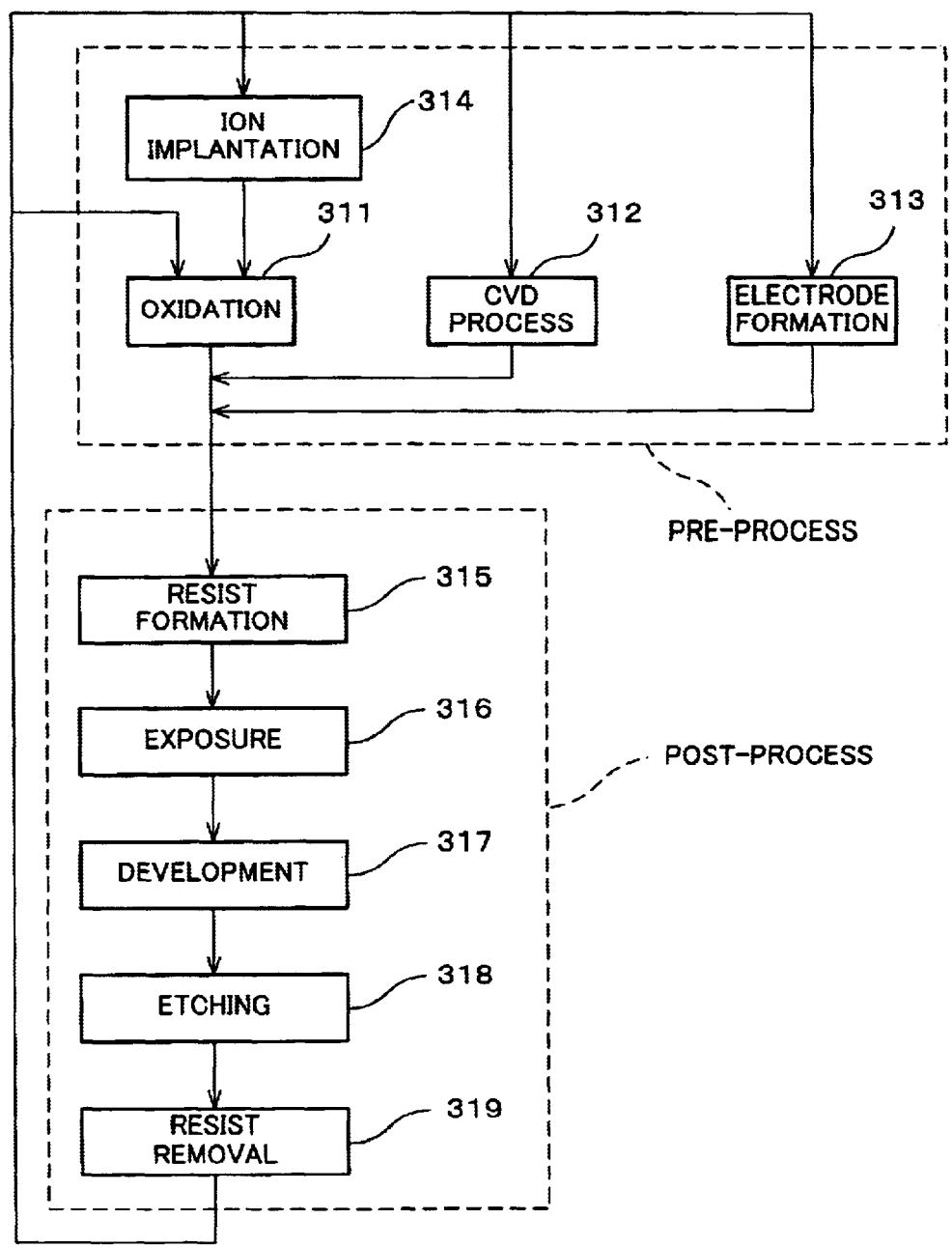
FIG. 15 is a flow chart showing a process in a wafer process step of FIG. 14.

FIG. 15 is a flow chart showing a detailed example of step 304 described above in manufacturing semiconductor devices. Referring to FIG. 15, in step 311 (oxidation step), the surface of a wafer is oxidized. In step 312 (CVD step), an insulating film is formed on the wafer surface. In step 313 (electrode formation step), electrodes are formed on the wafer by vapor deposition. In step 314 (ion implantation step), ions are implanted into the wafer. Steps 311 through 314 described above constitute a pre-process for each step in the wafer process and are selectively executed in accordance with the processing required in each step.

When the above pre-process is completed in each step in the wafer process, a post-process is executed as follows. In this post-process, first of all, in step 315 (resist formation step), the wafer is coated with a photosensitive material (resist). In step 316, the above exposure apparatus transfers a sub-pattern of the circuit on a mask onto the wafer according to the above method. In step 317 (development step), the exposed wafer is developed. In step 318 (etching step), an exposing member on portions other than portions on which the resist is left is removed by etching. In step 319 (resist removing step), the unnecessary resist after the etching is removed.

By repeatedly performing these pre-process and post-process, a multiple-layer circuit pattern is formed on each shot-area of the wafer.

In the above manner, the devices on which a fine pattern is accurately formed are manufactured with high mass-productivity.

Figure 16A:
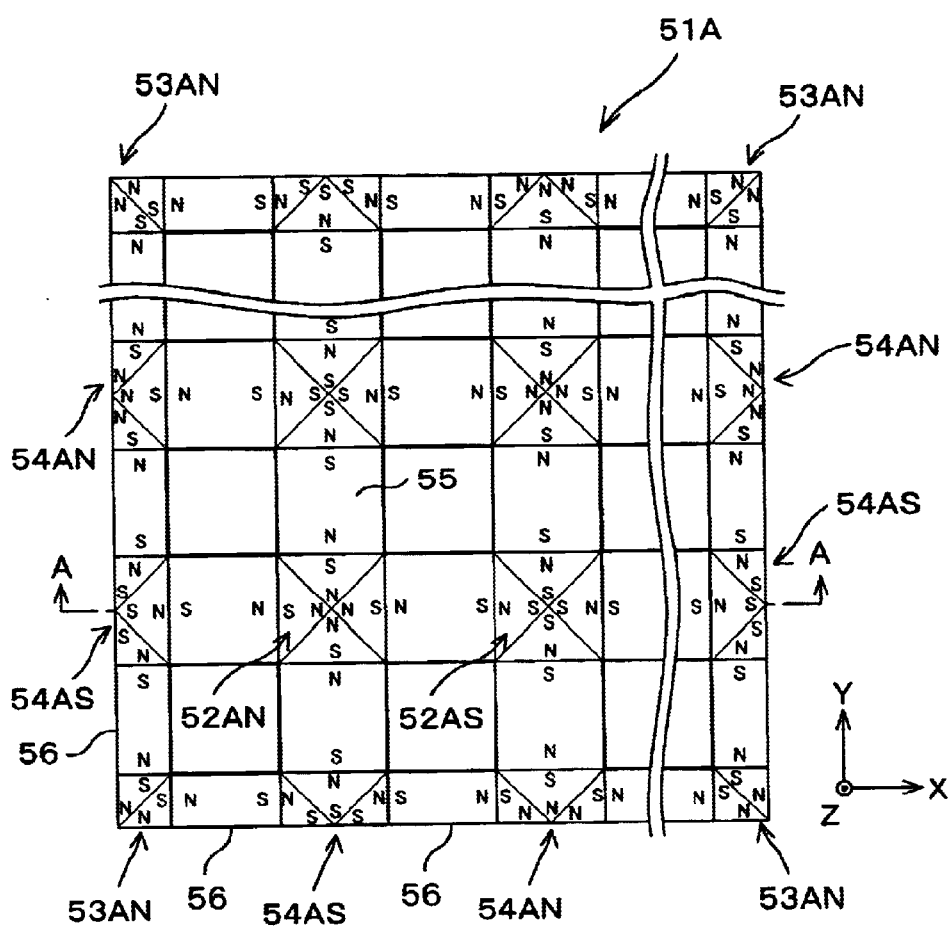
FIGS. 16A to 16C are diagrams illustrating the arrangement of a modified example (1) of the magnetic pole unit.
Figure 16B:
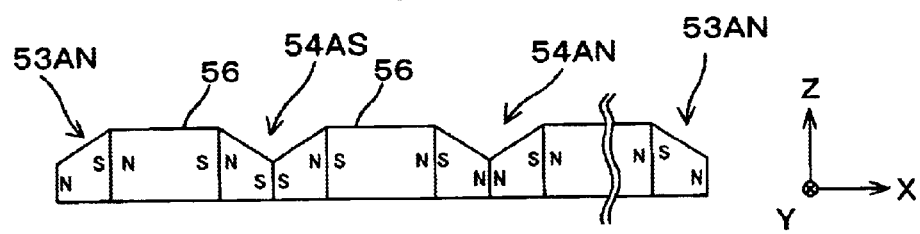
Figure 16C:
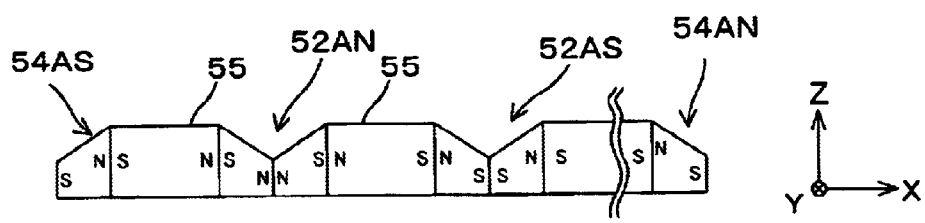

Note that although in this embodiment the magnetic pole unit 51 comprises a plurality of permanent magnets 52N, 52S, 53N, 54N, 54S that are magnetized in a direction almost perpendicular to the movement plane of the substrate table and the flat-plate-shaped magnetic member 59 supporting the plurality of permanent magnets, the magnetic pole unit may be a magnetic pole unit 51A, shown in FIG. 16A to 16C, that comprises a plurality of permanent magnet modules 52AN, 52AS, 53AN, 54AN, 54AS that are magnetized in a direction different from the direction perpendicular to the movement plane of the substrate table and the permanent magnets 55, 56 (modified example 1). It is noted that FIG. 16A is a plan view of the magnetic pole unit 51A, that FIG. 16B is a side view of the magnetic pole unit 51A as seen from below in FIG. 16A, and that FIG. 16C is a cross-sectional view taken along line A—A in FIG. 16A.

As recognized by comparing FIG. 3 and FIG. 16, the magnetic pole unit 51A of modified example 1 is obtained by replacing the permanent magnets 52N, 52S, 53N, 54N, 54S in the magnetic pole unit 51 respectively with the permanent magnet modules 52AN, 52AS, 53AN, 54AN, 54AS, and connecting any two adjacent ones of the permanent magnet modules via a permanent magnet 55 or 56, and by omitting the magnetic member 59. The magnetic pole unit 51A generates the same distribution of magnetic flux density as the magnetic pole unit 51. Therefore, in the same manner as the magnetic pole unit 51 does, the magnetic pole unit 51A can drive the substrate table 18 by controlling respective currents supplied to the armature coils.

Figure 17:
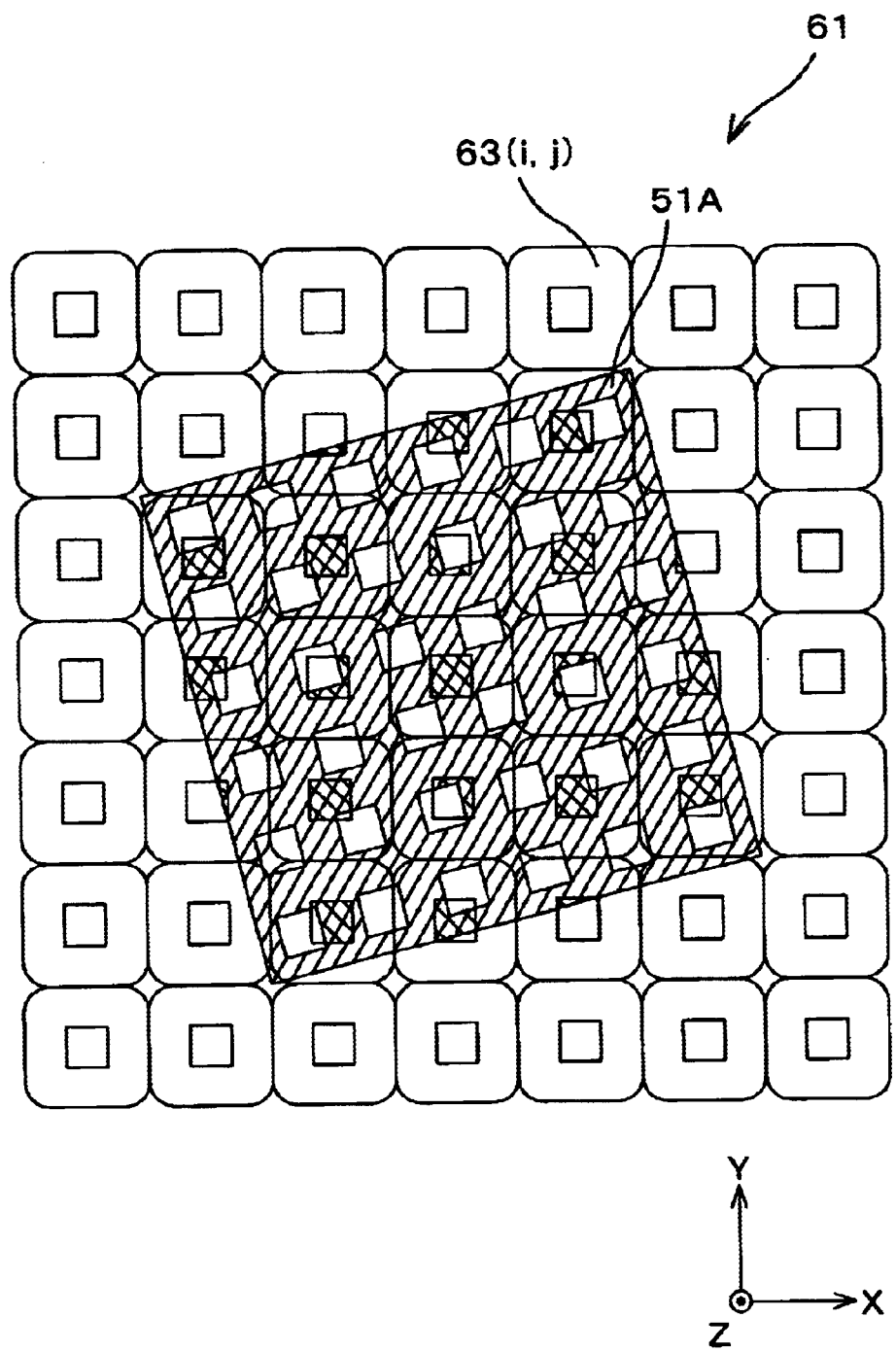
FIG. 17 is a diagram illustrating an example of the positional relation between the modified example (1), another magnetic pole unit, and the armature unit.

Also when the magnetic pole unit 51A is used, the inductance of an armature coil 63 varies according to the positional relation between the magnetic pole unit 51A and the armature coil 63. That is, because the permeability of permanent magnets composing the magnetic pole unit 51A is different from that of the air, the inductance of the armature coil 63 varies according to the size of the area of the hole of the armature coil 63, which area is covered by the magnetic pole unit 51A in a plan view. Therefore, for example, when there is a positional relation shown in FIG. 17 between the magnetic pole unit 51A and the flat-plate-shaped-coil module 61, inductances according to the areas of holes of armature coils 63, which areas are indicated by cross-hatching in FIG. 17, are measured. And the X-Y position and yaw θ of the magnetic pole unit 51A, i.e. The substrate table 18, can be detected based on the measured inductances, the shape of the hole of an armature coil 63, the arrangement of the armature coils 63 and the shape of the magnetic pole unit 51A.

Figure 18A:
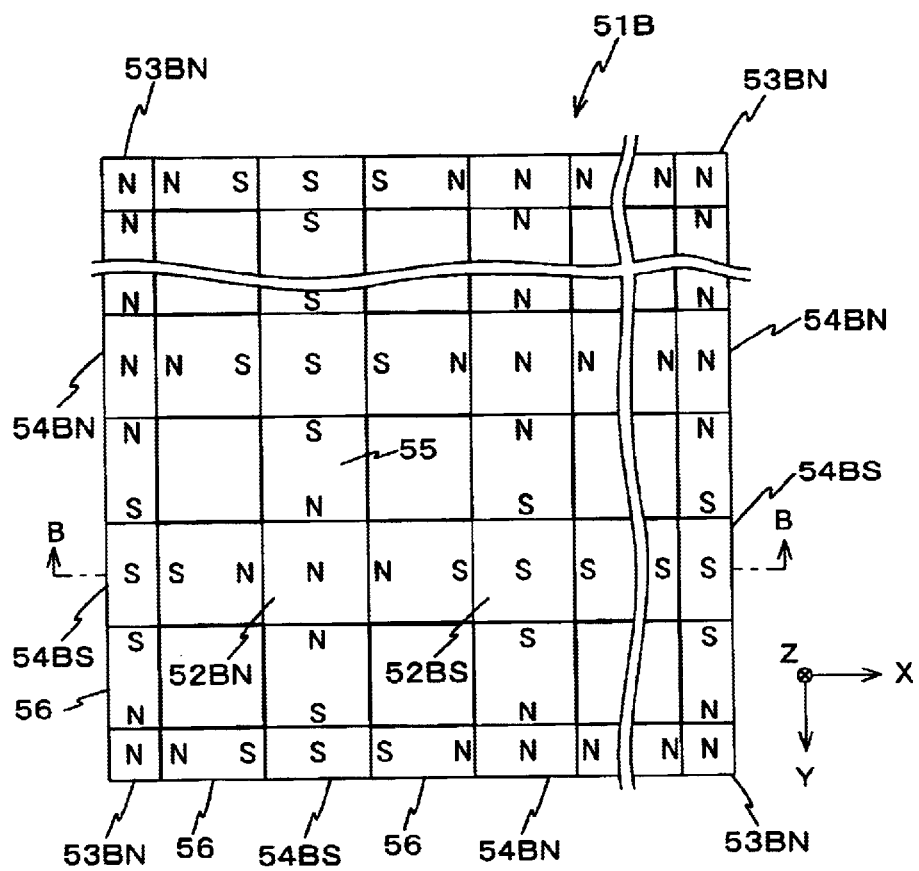
FIGS. 18A to 18C are diagrams illustrating the arrangement of a modified example (2) of the magnetic pole unit.
Figure 18B:
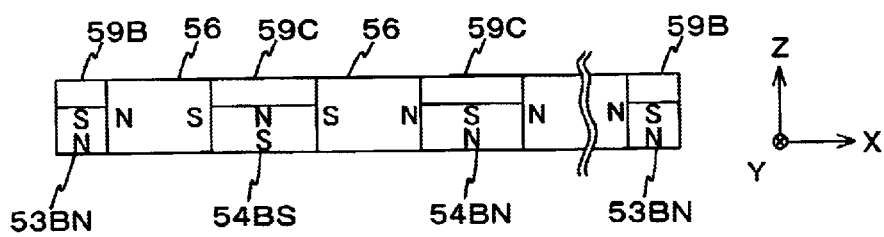
Figure 18C:
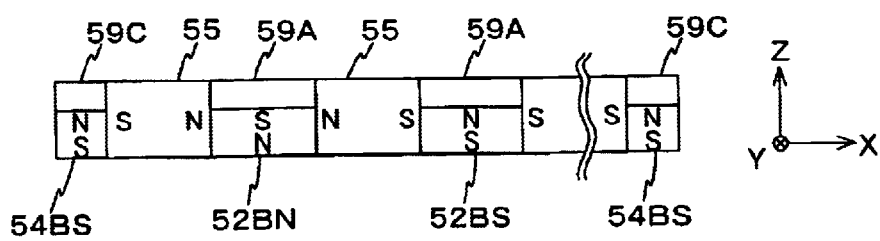

Also, the magnetic pole unit 51B (modified example 2), which is shown in FIG. 18A to FIG. 18C and obtained by replacing the permanent magnet modules 52AN, 52AS, 53AN, 54AN, 54AS in the magnetic pole unit 51A of the modified example 1 with pairs of a permanent magnet 52BN, 52BS, 53BN, 54BN, 54BS and a magnetic member 59A, 59B, 59C, can be used instead of the magnetic pole unit 51 of the above embodiment, the permanent magnets being magnetized in a direction almost perpendicular to the movement plane of the substrate table. In this case, the magnetic pole unit has the permanent magnets 52BN, 52BS, 53BN, 54BN, 54BS, which are magnetized in a direction almost perpendicular to the movement plane of the substrate table, and the permanent magnets 55, 56, which are magnetized in a direction different from the direction perpendicular to the movement plane of the substrate table. Note that FIG. 18A is a bottom view of the magnetic pole unit 51B, that FIG. 18B is a side view of the magnetic pole unit 51B as seen from below in FIG. 18A, and that FIG. 18C is a cross-sectional view taken along line B—B in FIG. 18A.

The magnetic pole unit 51B generates the same distribution of magnetic flux density as the magnetic pole unit 51 does. Therefore, in the same manner as the magnetic pole unit 51 does, the magnetic pole unit 51B can drive the substrate table 18 by controlling respective currents supplied to armature coils.

Also when the magnetic pole unit 51B is used, inductances according to the areas of holes of armature coils 63, which areas are indicated by cross-hatching in FIG. 17, are measured in the same way as in the modified example 1. And the X-Y position and yaw θ of the magnetic pole unit 51B, i.e. The substrate table 18, can be detected based on the measured inductances, the shape of the hole of an armature coil 63, the arrangement of the armature coils 63 and the shape of the magnetic pole unit 51B.

Furthermore, although in the above embodiment the magnetic member 62 is employed to support armature coils 63, a non-magnetic member can support the armature coils 63, and also in this case, the X-Y position and yaw θ of the substrate table 18 can be detected based on measurement results of the inductances of the armature coils 63.

Moreover, instead of the air guide mechanism used in the above embodiment a magnetic levitation mechanism may be employed to levitate a mover from a stator. And instead of permanent magnets, electromagnets equivalent to the permanent magnets may be used.

Also, the shape and arrangement of magnets in the magnetic pole unit and the shape and arrangement of armature coils in the armature unit are not limited to the above embodiment and the modified examples, and can be determined according to the type of electromagnetic force to be adopted.

Furthermore, although in this embodiment a liquid coolant is used to cool down armature coils, a gas coolant may be used that is a fluid that can serve as a coolant.

Additionally, the number of magnetic pole units 51 provided on the stator is not limited to one. By driving two magnetic pole units 51 provided on a stator 60 independently, while performing exposure of a wafer on a magnetic pole unit 51, another wafer can be loaded or unloaded onto the other magnetic pole unit 51.

Moreover, as an optical integrator (homogenizer), a rod-integrator may be employed instead of the fly eye lens in the above embodiment. In an illumination optical system using a rod-integrator, the rod-integrator is so arranged that light emitting surface thereof is almost conjugate to the pattern surface of a reticle R. An illumination optical system using such a rod-integrator is disclosed in, for example, U.S. Pat. No. 5,675,401. The disclosure in the above U.S. Patent is incorporated herein by reference as long as the national laws in designated states or elected states, to which this international application is applied, permit. Furthermore, the combination of a fly eye lens and a rod-integrator, or a double optical integrator where two fly eye lenses or rod-integrators are disposed in series may be employed.

Moreover, although the above embodiment describes a case where the present invention is applied to an exposure apparatus using the step-and-scan method, the scope of the present invention is not limited to that and can be preferably applied to stationary-exposure-type exposure apparatus such as a stepper.

Also, for example, in an exposure apparatus employing ultraviolet light, a reflection system composed of only reflection optical elements or a reflection-refraction system (catadioptric system) having reflection optical elements and refraction optical elements may be used as the projection optical system. As a reflection-refraction type of projection optical system, a reflection-refraction system having a beam-splitter and concave mirror as reflection optical elements, which system is disclosed in, for example, Japanese Patent Laid-Open No. 8-171054 and U.S. Pat. No. 5,668,672 corresponding thereto, and Japanese Patent Laid-Open No. 10-20195 and U.S. Pat. No. 5,835,275 corresponding thereto, or a reflection-refraction system not having a beam-splitter but having a concave mirror, etc., as reflection optical elements, which system is disclosed in, for example, Japanese Patent Laid-Open No. 8-334695 and U.S. Pat. No. 5,689,377 corresponding thereto, and Japanese Patent Laid-Open No. 10-3039 and U.S. patent application No. 873,605 corresponding thereto (application date: Jun. 12, 1997), may be used. The disclosures in the above Japanese Patent Laid-Opens, U.S. Patents and U.S. Patent Application are incorporated herein by reference as long as the national laws in designated states or elected states, to which this international application is applied, permit.

And as a reflection-refraction type of projection optical system, a reflection-refraction system, disclosed in Japanese Patent Laid-Open No. 10-104513 and U.S. Pat. No. 5,488,229, in which a plurality of refraction optical elements and two mirrors (a concave mirror as a main mirror and a back surface mirror which is a refraction optical element or plane parallel plate having a reflection surface formed on the opposite side to the incident surface thereof and which serves as a sub-mirror) are disposed along one axis and in which the intermediate image of a reticle pattern, which image is formed by the plurality of refraction optical elements, is imaged on a wafer with the main and sub mirrors may be used. In this reflection-refraction system, the main and sub mirrors are arranged following the plurality of refraction optical elements; illumination light passes through part of the main mirror, is reflected by the sub-mirror and the main mirror in turn, passes through part of the sub-mirror and reaches the wafer. The disclosures in the above Japanese Laid-Open and U.S. Patent are incorporated herein by reference as long as the national laws in designated states or elected states, to which this international application is applied, permit.

Furthermore, as a reflection-refraction type of projection optical system, a reduction optical system which has a circular image field, which is telecentric in the object plane and image plane sides, and which has a projection magnification of ¼ or ⅕ may be used. In a scanning exposure apparatus comprising a reflection-refraction type of projection optical system, the illumination area of illumination light may be in the shape of a rectangular slit of which the center almost coincides with the optical axis of the projection optical system and which is extending in a direction almost perpendicular to the scanning direction of a reticle or wafer. By using a scanning exposure apparatus comprising such a reflection-refraction-type projection optical system, fine patterns with lines and spaces of about 100 nm can be accurately transferred onto a wafer with using, for example, $F_2$ laser light having a wavelength of 157 nm as illumination light for exposure.

Moreover, although usually ArF excimer laser light, $F_2$ laser light, etc., are employed as vacuum ultraviolet light, if only a beam monitor mechanism and a reference wavelength light source are housed in the same environment-controlled chamber as the projection optical system is in, a higher harmonic wave which is obtained with wavelength conversion into ultraviolet by using a non-linear optical crystal after amplifying single wavelength laser light, infrared or visible, emitted from a DFB semiconductor laser device or a fiber laser by a fiber amplifier having, for example, erbium (or both erbium and ytterbium) doped may be used.

For example, assuming that the oscillation wavelength of a single wavelength laser is in the range of 1.51 through 1.59 um, an eight-time-higher harmonic wave of which the wavelength is in the range of 189 through 199 nm or a ten-time-higher harmonic wave of which the wavelength is in the range of 151 through 159 nm is emitted. Especially, when the oscillation wavelength is in the range of 1.544 through 1.553 um, an eight-time-higher harmonic wave of which the wavelength is in the range of 193 through 194 nm, that is ultraviolet light having almost the same wavelength as ArF excimer laser light, is obtained, and when the oscillation wavelength is in the range of 1.57 through 1.58 um, an ten-time-higher harmonic wave of which the wavelength is in the range of 157 through 158 nm, that is ultraviolet light having almost the same wavelength as $F_2$ laser light, is obtained.

Furthermore, when the oscillation wavelength is in the range of 1.03 through 1.12 um, an seven-time-higher harmonic wave of which the wavelength is in the range of 147 through 160 nm is emitted, and especially when the oscillation wavelength is in the range of 1.099 through 1.106 um, an seven-time-higher harmonic wave of which the wavelength is in the range of 157 through 158 nm, that is ultraviolet light having almost the same wavelength as $F_2$ laser light, is obtained. In this case, for example, a ytterbium-doped fiber laser can be employed as the single wavelength laser.

Moreover, the present invention can be applied not only to an exposure apparatus for manufacturing micro devices such as semiconductor devices but also to an exposure apparatus transferring a circuit pattern onto a glass substrate or silicon wafer so as to produce a reticle or mask used by a light exposure apparatus, EUV (Extreme Ultraviolet) exposure apparatus, X-ray exposure apparatus, electron beam exposure apparatus, etc. Incidentally, in an exposure apparatus using DUV (far ultraviolet) light or VUV (vacuum ultraviolet) light, a transmission-type reticle is generally used, and as the substrate of the reticle, is employed quartz glass, quartz glass with fluorine doped, fluorite, magnesium fluoride, or quartz crystal. And an X-ray exposure apparatus of a proximity method or an electron beam exposure apparatus employs a transmission-type mask (stencil-mask, membrane-mask); an EUV exposure apparatus employs a reflection-type mask, and as the substrate of the mask, silicon wafer or the like is employed. Moreover, when this invention is applied to a reduced projection exposure apparatus using soft X-ray having a wavelength of about 15 nm as its light source, an X-ray exposure apparatus using X-ray having a wavelength of about 1 nm as its light source, and an exposure apparatus using an EB (Electron Beam) or ion beam, the space in which the wafer, etc., are placed needs to be a vacuum. Therefore, the air guide mechanism cannot be used as the levitation mechanism for levitating a mover from a stator, and it is necessary to employ a magnetic levitation mechanism.

Needless to say, the present invention can be applied not only to an exposure apparatus for manufacturing semiconductor devices but also to an exposure apparatus for transferring a device pattern onto a glass plate in the manufacture of displays such as liquid crystal display devices and plasma displays, an exposure apparatus for transferring a device pattern onto a ceramic plate in the manufacture of thin magnetic heads, and an exposure apparatus for the manufacture of pick-up devices (CCD, etc.).

In addition, a stage unit according to this invention is not limited to the substrate stage unit of an exposure apparatus and can also be applied to, for example, a reticle stage unit of an exposure apparatus, and to any case where the position control of a sample is needed. Note that when applying the stage unit of the present invention to a unit other than an exposure apparatus, the position of a sample may be controlled only based on position detection results obtained from the measurement of inductances of armature coils depending on the required accuracy of position control.

INDUSTRIAL APPLICABILITY

As described above, because based on information concerning inductances of coils of the stator, which inductances vary in accordance with the relative-position relation between the stator and the mover, the position information of the mover is detected, and the position of the mover is controlled, a planar motor unit and driving method thereof of the present invention are suitable to successively drive the mover while maintaining the driving accuracy of the mover.

Also, because based on information concerning inductances of coils of the stator, which inductances vary in accordance with the relative-position relation between the stator and the mover, the position information of a stage member connected with the mover is a detected, and the position of the stage member is controlled, a stage unit and driving method thereof of the present invention are suitable to successively drive the stage member while maintaining the positioning accuracy of the stage member, regardless of the variation amount of the position and yaw of the stage member.

Furthermore, because the position of an object that is placed in the path of illumination light (energy beam) for exposure can be successively controlled while maintaining the positioning accuracy of the object, an exposure apparatus and exposure method of the present invention are suitable for performing exposure with high throughput. Therefore, the exposure apparatus and exposure method of the present invention are suitable for manufacturing devices having fine patterns with high productivity.

What is claimed is:

1. A planar motor comprising: a stator having a coil; and a mover having a magnetic flux generator, the planar motor moving the mover on a movement plane by electromagnetic force which is generated between the coil and the magnetic flux generator, further comprising:

a controller that detects position information of the mover based on information concerning an inductance of the coil, the inductance varying in accordance with the relative-position relation between the stator and the mover.

2. A planar motor according to claim 1, wherein the stator comprises a plurality of coils, and wherein the controller detects position information of the mover based on an inductance distribution with respect to the plurality of coils, the inductance distribution being generated in accordance with the relative-position relation between the stator and the mover.

3. A planar motor according to claim 2, wherein the stator comprises a coil-supporting member that is made of a magnetic material and that supports the plurality of coils.

4. A planar motor according to claim 1, wherein the position information of the mover includes at least one of a piece of position information with respect to a first axis direction and a second axis direction that define the movement plane, and a piece of position information with respect to rotation about a third axis perpendicular to the first axis direction and the second axis direction.

5. A planar motor according to claim 1, wherein the controller controls an electric current supplied to the coil based on a detection result of position information of the mover.

6. A planar motor according to claim 1, wherein the magnetic flux generator comprises a plurality of magnets magnetized in a direction almost perpendicular to the movement plane.

7. A planar motor according to claim 6, wherein the magnetic flux generator further comprises a magnet-supporting member that is made of a magnetic material and that supports the plurality of magnets.

8. A planar motor according to claim 1, wherein the magnetic flux generator comprises a plurality of magnets magnetized in a direction not perpendicular to the movement plane.

9. A planar motor according to claim 1, further comprising:

an inductance measurement unit to measure an inductance of the coil.

10. A planar motor comprising: a stator having a coil; and a mover having a magnet, the planar motor moving the mover on a movement plane by eletromagnetic force which is generated between the coil and the magnet, further comprising:

a controller that controls position of the mover based on information concerning an inductance of the coil, the inductance varying in accordance with the relative-position relation between the stator and the mover.

11. A planar motor according to claim 10, wherein the stator comprises a plurality of coils, and wherein the controller controls position of the mover based on an inductance distribution with respect to the plurality of coils, the inductance distribution being generated in accordance with the relative-position relation between the stator and the mover.

12. A planar motor according to claim 10, further comprising:

an inductance measurement unit to measure an inductance of the coil.

13. A stage unit comprising:

a planar motor according to claim 1; and a stage member connected with the mover.

14. An exposure apparatus comprising:

an illumination system sending out illumination light for exposure; and a stage unit according to claim 13 on which an object to be arranged in a path of the illumination light is mounted.

15. A device on which a predetermined pattern is formed, and which is manufactured by using an exposure apparatus according to claim 14.

16. A stage unit comprising:

a stage member moving on a movement plane;

a driving unit comprising: a mover that has a magnetic flux generator and that is provided on the stage member and a stator having a plurality of coils, the driving unit driving the stage member by electromagnetic force which is generated between the coils and the magnetic flux generator;

an inductance measurement unit to measure inductances of the coils; and a controller to control respective electric currents supplied to the plurality of coils based on measurement results by the inductance measurement unit.

17. A stage unit according to claim 16, wherein the magnetic flux generator comprises a plurality of magnets magnetized in a direction almost perpendicular to the movement plane.

18. A stage unit according to claim 17, wherein the stage member is made of a non-magnetic material, and wherein the magnetic flux generator further comprises a magnet-supporting member that is made of a magnetic material and that supports the plurality of magnets.

19. A stage unit according to claim 16, wherein the magnetic flux generator comprises a plurality of magnets magnetized in a direction not perpendicular to the movement plane.

20. A stage unit according to claim 16, wherein the stator comprises a coil-supporting member that is made of a magnetic material and that supports the plurality of coils.

21. A stage unit according to claim 20, further comprising:

a position detection unit to detect position of the stage member, and wherein the controller controls respective electric currents supplied to the plurality of coils based on at least one of a detection result by the position detection unit and a set of measurement results by the inductance measurement unit.

22. A stage unit according to claim 21, wherein when the position detection unit can detect position of the stage member, the controller controls position of the stage member by controlling respective electric currents supplied to the plurality of coils based on a detection result by the position detection unit, and wherein when the position detection unit cannot detect position of the stage member, the controller controls position of the stage member by controlling respective electric currents supplied to the plurality of coils based on measurement results by the inductance measurement unit.

23. An exposure apparatus comprising:

an illumination system sending out illumination light for exposure; and a stage unit according to claim 16, on which an object to be arranged in a path of the illumination light is mounted.

24. An exposure apparatus according to claim 23,
wherein the object is a substrate which is exposed by the illumination light, and onto which a predetermined pattern is transferred.

25. An exposure apparatus comprising:
an illumination system sending out illumination light for exposure; and
a stage unit according to claim 21, on which an object to be arranged in a path of the illumination light is mounted.

26. An exposure apparatus according to claim 25,
wherein the object is a substrate which is exposed by the illumination light, and onto which a predetermined pattern is transferred.

27. An exposure apparatus according to claim 25,
wherein when the position detection unit can detect position of the stage member, the controller controls position of the stage member by controlling respective electric currents supplied to the plurality of coils based on a detection result by the position detection unit,
wherein when the position detection unit cannot detect position of the stage member, the controller controls position of the stage member by controlling respective electric currents supplied to the plurality of coils based on measurement results by the inductance measurement unit, and
wherein upon exposure, when it is judged that the reason why the position detection unit cannot detect position of the stage member is the stage member being out of a range over which the position detection unit can detect position thereof, the controller restores the stage member to within the detection range of the position detection unit based on measurement results by the inductance measurement unit.

28. An exposure apparatus according to claim 27,
wherein after restoration of the stage member, the controller continues to control position of the stage member for exposure based on a detection result by the position detection unit.

29. An exposure apparatus according to claim 27,
wherein after restoration of the stage member, the controller moves the stage member to an initial position based on a detection result by the position detection unit.

30. An exposure apparatus according to claim 27,
wherein when the position detection unit can detect position of the stage member, the controller controls position of the stage member by controlling respective electric currents supplied to the plurality of coils based on a detection result by the position detection unit,
wherein when the position detection unit cannot detect position of the stage member, the controller controls position of the stage member by controlling respective electric currents supplied to the plurality of coils based on measurement results by the inductance measurement unit, and
wherein upon exposure, when the position detection unit cannot detect position of the stage member, the controller controls position of the stage member for exposure based on measurement results by the inductance measurement unit.

31. A device on which a predetermined pattern is formed, and which is manufactured by using an exposure apparatus according to claim 23.

32. A device on which a predetermined pattern is formed, and which is manufactured by using an exposure apparatus according to claim 25.

33. A driving method that drives a planar motor comprising: a stator having a coil; and a mover having a magnetic flux generator, so as to move the mover on a movement plane by electromagnetic force which is generated between the coil and the magnetic flux generator,
wherein position information of the mover is detected based on information concerning an inductance of the coil, the inductance varying in accordance with the relative-position relation between the stator and the mover.

34. A driving method of a planar motor according to claim 33,
wherein the stator comprises a plurality of coils, and
wherein position information of the mover is detected based on an inductance distribution with respect to the plurality of coils, the inductance distribution being generated in accordance with the relative-position relation between the stator and the mover.

35. A driving method of a planar motor according to claim 34,
wherein the stator comprises a coil-supporting member that is made of a magnetic material and that supports the plurality of coils.

36. A driving method of a planar motor according to claim 34,
wherein inductances of the plurality of coils are measured individually.

37. A driving method of a planar motor according to claim 33,
wherein the position information of the mover includes at least one of a piece of position information with respect to a first axis direction and a second axis direction that define the movement plane, and a piece of position information with respect to rotation about a third axis perpendicular to the first axis direction and the second axis direction.

38. A driving method of a planar motor according to claim 33,
wherein an electric current supplied to the coil is controlled based on a detection result of position information of the mover.

39. A driving method of a planar motor according to claim 33,
wherein the magnetic flux generator comprises a plurality of magnets magnetized in a direction almost perpendicular to the movement plane.

40. A driving method of a planar motor according to claim 39,
wherein the magnetic flux generator further comprises a magnet-supporting member that is made of a magnetic material and that supports the plurality of magnets.

41. A driving method of a planar motor according to claim 33,
wherein the magnetic flux generator comprises a plurality of magnets magnetized in a direction not perpendicular to the movement plane.

42. A driving method that drives a stage unit comprising a planar motor which comprises a stator having a coil and a mover having a magnetic flux generator, and which moves the mover on a movement plane, and a stage member moving as one entity with the mover,
wherein upon moving the stage member is used a driving method of a planar motor according to claim 33.

43. An exposure method comprising the steps of sending out illumination light for exposure and, by driving a stage unit on which an object is mounted, moving the object relative to a path of the illumination light, wherein upon driving the stage unit is used a driving method of a stage unit according to claim 42.

44. A device manufacturing method including a lithography process, wherein the lithography process uses an exposure method according to claim 43.

45. A driving method that drives a planar motor comprising: a stator having a coil; and a mover having a magnet, so as to move the mover on a movement plane by electromagnetic force which is generated between the coil and the magnet, wherein position of the mover is controlled based on information concerning an inductance of the coil, the inductance varying in accordance with the relative-position relation between the stator and the mover.

46. A driving method of a planar motor according to claim 45, wherein the stator comprises a plurality of coils, and wherein position of the mover is controlled based on an inductance distribution with respect to the plurality of coils, the inductance distribution being generated in accordance with the relative-position relation between the stator and the mover.

47. A driving method of a planar motor according to claim 46, wherein inductances of the plurality of coils are measured individually.

48. A driving method that drives a stage unit comprising a stage member moving on a movement plane and a driving unit comprising a mover which has a magnetic flux generator and which is provided on the stage member and a stator having a plurality of coils and driving the stage member by electromagnetic force which is generated between the coils and the magnetic flux generator, wherein respective electric currents supplied to the plurality of coils are controlled based on results of measuring inductances of the plurality of coils.

49. A driving method of a stage unit according to claim 48, wherein the magnetic flux generator comprises a plurality of magnets magnetized in a direction almost perpendicular to the movement plane.

50. A driving method of a stage unit according to claim 49, wherein the stage member is made of a non-magnetic material, and wherein the magnetic flux generator further comprises a magnet-supporting member that is made of a magnetic material and that supports the plurality of magnets.

51. A driving method of a stage unit according to claim 48, wherein the magnetic flux generator comprises a plurality of magnets magnetized in a direction not perpendicular to the movement plane.

52. A driving method of a stage unit according to claim 48, wherein the stator comprises a coil-supporting member that is made of a magnetic material and that supports the plurality of coils.

53. A driving method of a stage unit according to claim 52, wherein the stage unit further comprises a position detection unit to detect position of the stage member, and wherein respective electric currents supplied to the plurality of coils are controlled based on at least one of a detection result by the position detection unit and a set of measurement results of the inductances.

54. A driving method of a stage unit according to claim 53, wherein when the position detection unit can detect position of the stage member, position of the stage member is controlled by controlling respective electric currents supplied to the plurality of coils based on the result of detecting position, and wherein when the position detection unit cannot detect position of the stage member, position of the stage member is controlled by controlling respective electric currents supplied to the plurality of coils based on measurement results of the inductances.

55. An exposure method comprising the steps of sending out illumination light for exposure and, by driving a stage unit on which an object is mounted, moving the object relative to a path of the illumination light, wherein upon driving the stage unit is used a driving method of a stage unit according to claim 48.

56. An exposure method according to claim 55, wherein the object is a substrate which is exposed by the illumination light, and onto which a predetermined pattern is transferred.

57. An exposure method comprising the steps of sending out illumination light for exposure and, by driving a stage unit on which an object is mounted, moving the object relative to a path of the illumination light, wherein upon driving the stage unit is used a driving method of a stage unit according to claim 53.

58. An exposure method according to claim 57, wherein the object is a substrate which is exposed by the illumination light, and onto which a predetermined pattern is transferred.

59. An exposure method according to claim 57, wherein when the position detection unit can detect position of the stage member, position of the stage member is controlled by controlling respective electric currents supplied to the plurality of coils based on the result of detecting position, and wherein when the position detection unit cannot detect position of the stage member, position of the stage member is controlled by controlling respective electric currents supplied to the plurality of coils based on measurement results of the inductances, and wherein upon exposure, when it is judged that the reason why the position detection unit cannot detect position of the stage member is the stage member being out of a range over which the position detection unit can detect position thereof, the stage member is restored to within the detection range of the position detection unit based on measurement results of the inductances.

60. An exposure method according to claim 59, wherein after restoration of the stage member, position of the stage member continues to be controlled for exposure based on a detection result by the position detection unit.

61. An exposure method according to claim 59, wherein after restoration of the stage member, the stage member is moved to an initial position based on a detection result by the position detection unit.

62. An exposure method according to claim 57, wherein when the position detection unit can detect position of the stage member, position of the stage member is controlled by controlling respective electric currents supplied to the plurality of coils based on a result of detecting position of the stage member, wherein when the position detection unit cannot detect position of the stage member, position of the stage member is controlled by controlling respective electric currents supplied to the plurality of coils based on measurement results of the inductances, and wherein upon exposure, when the position detection unit cannot detect position of the stage member, position of the stage member is controlled for exposure based on measurement results of the inductances.

63. A device manufacturing method including a lithography process, wherein the lithography process uses an exposure method according to claim 55.

64. A device manufacturing method including a lithography process, wherein the lithography process uses an exposure method according to claim 57.

65. A stage unit comprising:

a planar motor according to claim 10; and a stage member connected with the mover.

66. A driving method that drives a stage unit comprising a planar motor which comprises a stator having a coil and a mover having a magnetic flux generator, and which moves the mover on a movement plane, and a stage member moving as one entity with the mover, wherein upon moving the stage member is used a driving method of a planar motor according to claim 45.

67. A planar motor comprising: a stator having a coil; and a mover having a magnetic flux generator, the planar motor moving the mover on a movement plane, wherein the magnetic flux generator comprises a plurality of magnets magnetized in a direction not perpendicular to the movement plane, and the planar motor further comprising:

a controller that detects position information of the mover based on information concerning an inductance of the coil, the inductance varying in accordance with the relative-position relation between the stator and the mover.

68. A stage unit comprising:

a stage member moving on a movement plane;

a driving unit comprising: a mover that has a magnetic flux generator comprising a plurality of magnets magnetized in a direction not perpendicular to the movement plane and that is provided on the stage member, and a stator having a plurality of coils, the driving unit driving the stage member by electromagnetic force;

an inductance measurement unit to measure inductances of the coils; and a controller to control respective electric currents supplied to the a plurality of coils based on measurement results by the inductance measurement unit.

69. A stage unit comprising:

a stage member moving on a movement plane;

a driving unit comprising: a mover that has a magnetic flux generator and that is provided on the stage member and a stator having a plurality of coils, the driving unit driving the stage member by electromagnetic force;

an inductance measurement unit to measure inductances of the coils;

a position detection unit to detect position of the stage member; and a controller to control respective electric currents supplied to the plurality of coils based on at least one of a detection result by the position detection unit and a set of measurement results by the inductance measurement unit.

70. An exposure apparatus comprising:

an illumination system sending out illumination light for exposure; and a stage unit according to claim 69, on which an object to be arranged in a path of the illumination light is mounted.

71. A driving method that drives a planar motor comprising: a stator having a coil; and a mover having a magnetic flux generator, so as to move the mover on a movement plane, wherein the magnetic flux generator comprises a plurality of magnets magnetized in a direction not perpendicular to the movement plane, and wherein position information of the mover is detected based on information concerning an inductance of the coil, the inductance varying in accordance with the relative-position relation between the stator and the mover.

72. A driving method that drives a stage unit comprising a stage member moving on a movement plane and a driving unit comprising a mover which has a magnetic flux generator comprising a plurality of magnets magnetized in a direction not perpendicular to the movement plane and which is provided on the stage member, and a stator having a plurality of coils and driving the stage member by electromagnetic force, wherein respective electric currents supplied to the plurality of coils are controlled based on results of measuring inductances of the plurality of coils.

73. A driving method that drives a stage unit comprising: a stage member moving on a movement plane and a driving unit comprising a mover which has a magnetic flux generator and which is provided on the stage member and a stator having a plurality of coils and driving the stage member by electromagnetic force, wherein the stage unit further comprises a position detection unit to detect position of the stage member, and wherein respective electric currents supplied to the plurality of coils are controlled based on at least one of a detection result by the position detection unit and a set of measurement results of the inductances.

74. An exposure method comprising the steps of sending out illumination light for exposure and, by driving a stage unit on which an object is mounted, moving the object relative to a path of the illumination light, wherein upon driving the stage unit is used a driving method of a stage unit according to claim 73.

* * * * *